(12) United States Patent
Cheung

(10) Patent No.: US 10,241,149 B2
(45) Date of Patent: Mar. 26, 2019

(54) MASSIVELY PARALLEL WAFER-LEVEL RELIABILITY SYSTEM AND PROCESS FOR MASSIVELY PARALLEL WAFER-LEVEL RELIABILITY TESTING

(71) Applicant: THE UNITED STATES OF AMERICA, AS REPRESENTED BY THE SECRETARY OF COMMERCE, Washington, DC (US)

(72) Inventor: Kin P. Cheung, Rockville, MD (US)

(73) Assignee: THE UNITED STATES OF AMERICA, AS REPRESENTED BY THE SECRETARY OF COMMERCE, Washington, DC (US)

( * ) Notice: Subject to any disclaimer, the term of this patent is extended or adjusted under 35 U.S.C. 154(b) by 114 days.

(21) Appl. No.: 15/275,345

(22) Filed: Sep. 24, 2016

(65) Prior Publication Data
US 2017/0089950 A1    Mar. 30, 2017

Related U.S. Application Data

(60) Provisional application No. 62/232,168, filed on Sep. 24, 2015.

(51) Int. Cl.
*G01R 31/28*    (2006.01)

(52) U.S. Cl.
CPC ...... *G01R 31/2874* (2013.01); *G01R 31/2855* (2013.01); *G01R 31/2894* (2013.01)

(58) Field of Classification Search
CPC .............. G01R 1/0491; G01R 31/2874; G01R 31/2855
See application file for complete search history.

(56) References Cited

U.S. PATENT DOCUMENTS

| | | | |
|---|---|---|---|
| 6,249,132 B1 * | 6/2001 | Amemiya .......... | G01R 31/2851 324/750.08 |
| 9,335,347 B2 | 5/2016 | Andberg et al. | |
| 2008/0224723 A1 * | 9/2008 | Washio .............. | G01R 31/2863 324/758.01 |
| 2011/0156735 A1 * | 6/2011 | Breinlinger .......... | G01R 1/0491 324/750.19 |
| 2014/0070828 A1 * | 3/2014 | Andberg ................ | G01R 1/073 324/750.02 |

* cited by examiner

*Primary Examiner* — Walter L Lindsay, Jr.
*Assistant Examiner* — Milton Gonzalez
(74) *Attorney, Agent, or Firm* — Office of Chief Counsel for National Institute of Standards and Technology

(57) ABSTRACT

A massively parallel wafer-level reliability system to test a reliability of wafers includes: a test platform; stations disposed on the test platform, wherein an individual test station receives a wafer and includes: a chuck disposed on the test platform; a probe including contactors that electrically contact the wafer; and a temperature controller to control a temperature of the wafer; a control platform disposed among the test stations; and a system controller to independently control the test stations and that is in electrical communication with the temperature controller, wherein the reliability of the wafers is tested in parallel by the test stations.

20 Claims, 38 Drawing Sheets

102

A)

102

B)

A)

B)

A)

B)

MASSIVELY PARALLEL WAFER-LEVEL RELIABILITY SYSTEM AND PROCESS FOR MASSIVELY PARALLEL WAFER-LEVEL RELIABILITY TESTING

CROSS REFERENCE TO RELATED APPLICATIONS

This application claims the benefit of U.S. Provisional Patent Application Ser. No. 62/232,168, filed Sep. 24, 2015, the disclosure of which is incorporated herein by reference in its entirety.

STATEMENT REGARDING FEDERALLY SPONSORED RESEARCH

This invention was made with United States Government support from the National Institute of Standards and Technology. The Government has certain rights in the invention.

BRIEF DESCRIPTION

Disclosed is a massively parallel wafer-level reliability system to test a reliability of a plurality of wafers, the system comprising: a test platform; a plurality of test stations disposed on the test platform, wherein an individual test station receives a wafer of the plurality of wafers and comprises: a chuck disposed on the test platform to receive the wafer; a probe comprising a plurality of contactors, the contactors to electrically contact the wafer disposed on the chuck; and a temperature controller disposed on the chuck to control a temperature of the wafer disposed on the chuck; a control platform disposed among the plurality of test stations, the test platform and the control platform having relative motion such that the test stations are selectively positioned with respect to a location of a fiduciary disposed on the control platform, and a system controller disposed on the control platform to independently control the test stations and in electrical communication with the temperature controller, wherein the reliability of the wafers is tested in parallel by the test stations.

Also disclosed is a process for massively parallel wafer-level reliability testing, the process comprising: providing a massively parallel wafer-level reliability system that comprises: a test platform; a plurality of test stations disposed on the test platform, wherein an individual test station comprises: a chuck disposed on the test platform; a probe comprising a plurality of contactors, the contactors to electrically contact the wafer disposed on the chuck; and a temperature controller disposed on the chuck to control a temperature of the wafer disposed on the chuck; a control platform disposed among the plurality of test stations, the test platform and the control platform having relative motion such that the test stations are selectively positioned with respect to a location of a fiduciary disposed on the control platform, and a system controller disposed on the control platform and in electrical communication with the temperature controller, disposing a plurality of wafers on the massively parallel wafer-level reliability system such that individual test stations receive a wafer disposed on the chuck; contacting the wafer disposed on the chuck with the contactors of the probe; and testing, in parallel, a reliability of the wafers to perform massively parallel wafer-level reliability testing.

BRIEF DESCRIPTION OF THE DRAWINGS

The following descriptions should not be considered limiting in any way. With reference to the accompanying drawings, like elements are numbered alike.

DETAILED DESCRIPTION

Figure 1:
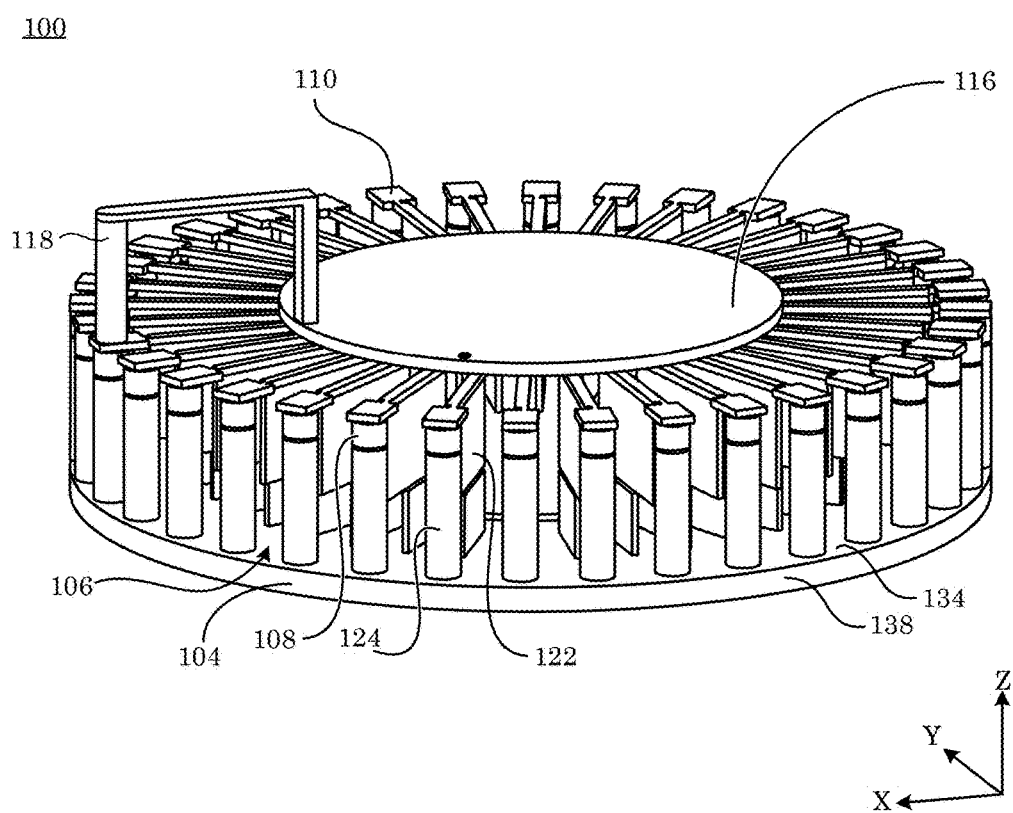
FIG. 1 shows a perspective view of a massively parallel wafer-level reliability system.

A detailed description of one or more embodiments is presented herein by way of exemplification and not limitation.

Semiconductor device reliability can be determined from data acquired from accelerated tests at elevated temperatures and increased voltages applied to a device under test. An accuracy of the reliability predicted effects can be affected by testing statistics such as a number of devices that are tested, and the number of devices tested to produce statistically robust results can depend on a type of defect test or test conditions as well as a type of device and its architecture. Confidence bounds for failure distributions can be spread with low statistics and can include significant error. With variability of new technology of devices, confidence bounds can have greater spread and a larger number of devices should be tested to maintain statistical confidence in results from data. Advantageously, the massively parallel wafer-level reliability system herein provides testing of a large number of devices at each test condition for performing tests on each device in parallel with easily reconfigurable tests. Additionally, accelerated tests are can be performed with the massively parallel wafer-level reliability system. Unexpectedly and surprisingly, reliability tests such as time dependent dielectric breakdown (TDDB) are performed by the massively parallel wafer-level reliability system, wherein such tests are robustly conducted in parallel in a relatively short amount of time with highly reproducible, statistically meaningful results on a large number of devices without a significant amount of testing equipment. Beneficially, the massively parallel wafer-level reliability system is a compact wafer-level testing platform where the number of test stations with probes are scalable from few stations to a massive number of stations.

As used herein, "reliability" refers to a time to failure under predefined operating conditions of a device (e.g., a circuit block, transistor, capacitor, inductor, and the like) or a test structure such as a large area capacitor that multiplies an effect of an accelerated stress (e.g., voltage, temperature, strain, and the like).

As used herein, "massively parallel" (its variants and related phrases including "in parallel," "tested in parallel," "determined in parallel," and the like) refers to coordinated testing, by a plurality of test stations, of a plurality of wafers, wherein an individual wafer is tested by an individual test station such that the test stations work independently on their respective wafer, performing independent tests that may be identical or different.

As used herein, "wafer-level" refers to any fabrication process, including testing and quality control processes, performed on a wafer substrate containing many repeated collections of semiconductor circuits or devices. It is contemplated that wafer level testing is performed before individual collections of circuits or devices are cut from the wafer and packaged or connected to other host device components.

Figure 2:
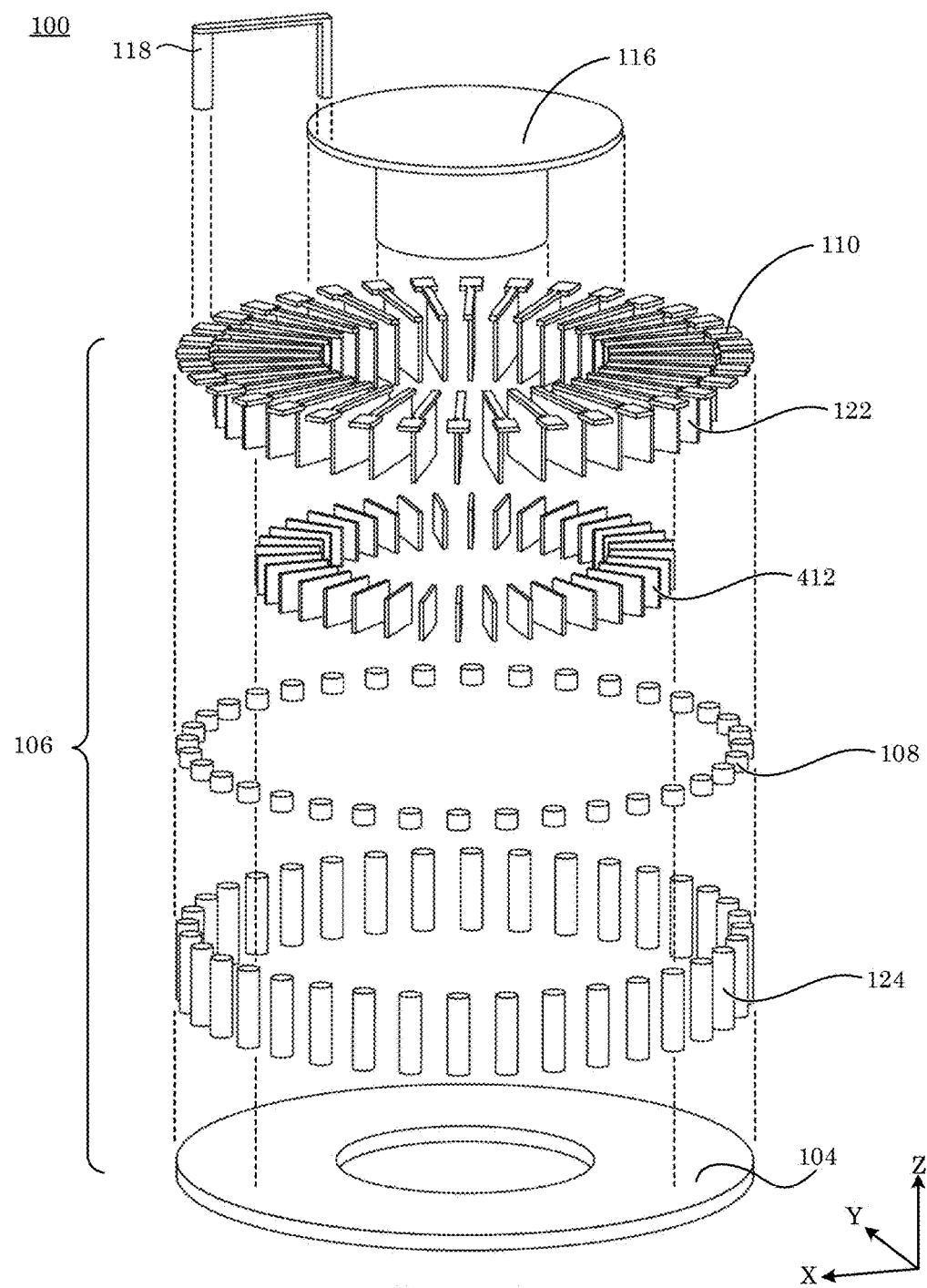
FIG. 2 shows an exploded view of the massively parallel wafer-level reliability system shown in FIG. 1.
Figure 3:
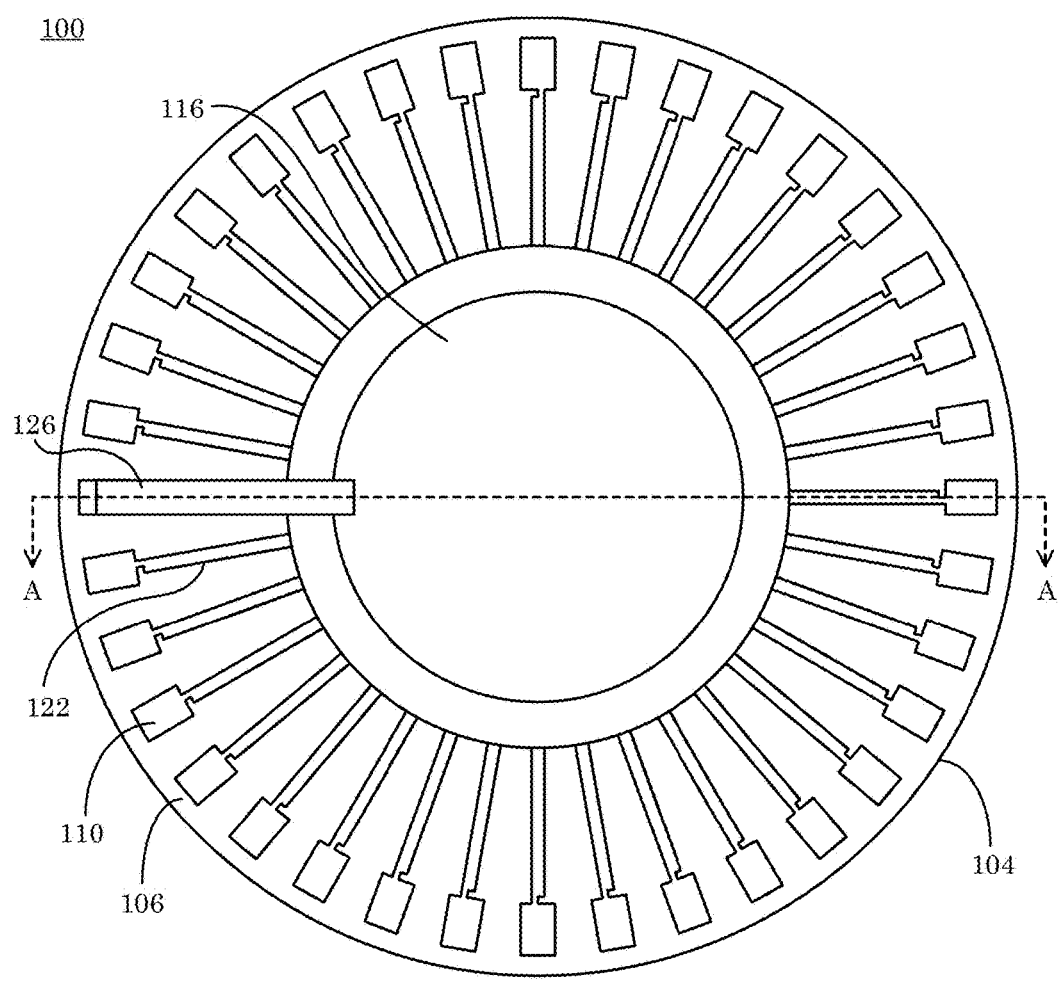
FIG. 3 shows a top view of the massively parallel wafer-level reliability system shown in FIG. 1.
Figure 4:
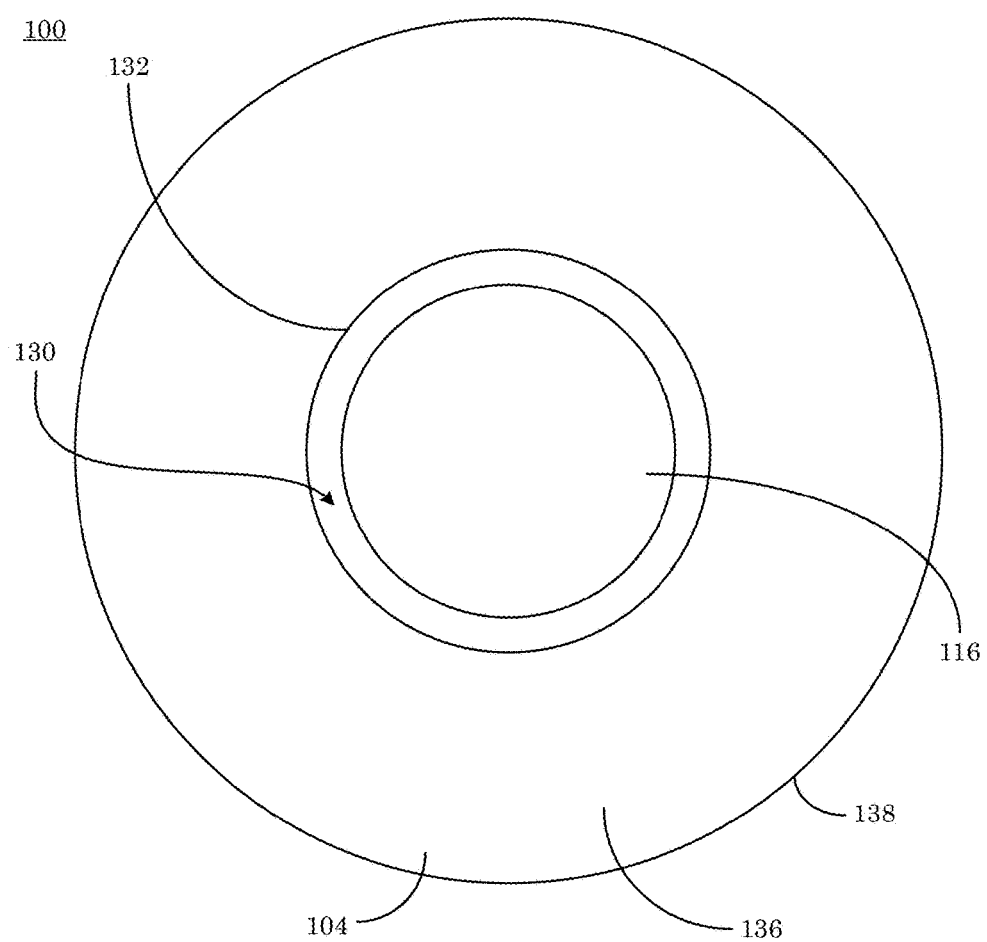
FIG. 4 shows a bottom view of the massively parallel wafer-level reliability system shown in FIG. 1.
Figure 5:
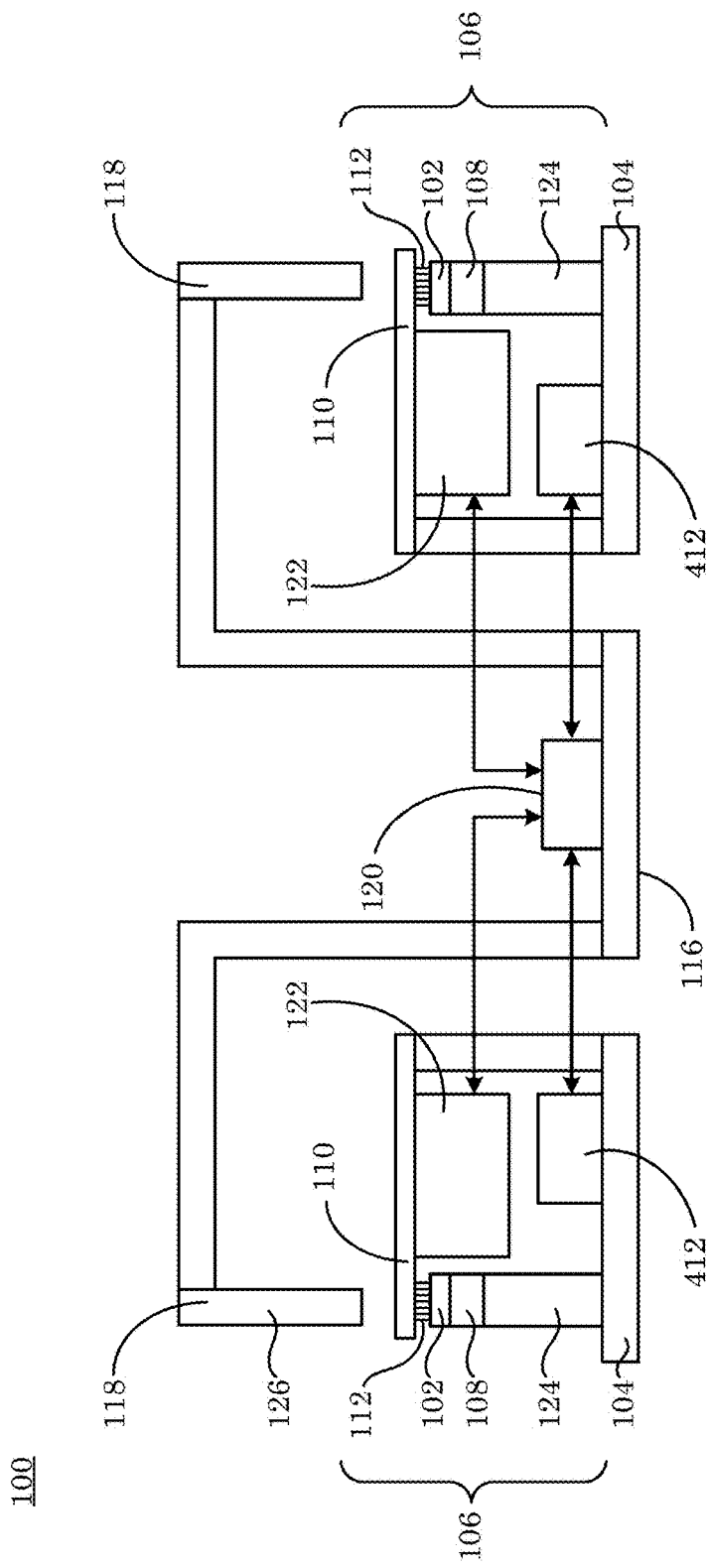
FIG. 5 shows a cross-sectional view along line A-A of the massively parallel wafer-level reliability system shown in FIG. 3.

In an embodiment, the massively parallel wafer-level reliability system tests a reliability of a plurality of wafers. With reference to FIG. 1 (perspective view), FIG. 2 (exploded view), FIG. 3 (top view) FIG. 4 (bottom view), FIG. 5 (cross-sectional view along line A-A shown in FIG. 3), massively parallel wafer-level reliability system 100 includes test platform 104; a plurality of test stations 106 disposed on test platform 104, wherein individual test station 106 receives wafer 102 of the plurality of wafers and includes: chuck 108 disposed on test platform 104 to receive wafer 102; probe 110 including a plurality of contactors 112, contactors 112 to electrically contact wafer 102 disposed on chuck 108; and temperature controller 114 disposed on chuck 108 to control a temperature of wafer 102 disposed on chuck 108; control platform 116 disposed among the plurality of test stations 106, test platform 104 and control platform 116 having relative motion such that test stations 106 are selectively positioned with respect to a location of fiduciary 118 disposed on control platform 116; and system controller 120 to independently control test stations 106 and in electrical communication with temperature controller 114, wherein the reliability of wafers 102 is tested in parallel by test stations 106. Here, relative motion between control platform 116 and test stations 106 disposed on test platform 104 is substantially rotary motion of test stations 106 about control platform 116.

Massively parallel wafer-level reliability system 100 can include probe controller 122 in electrical communication with contactors 112. Probe controller 122 controls an electronic functionality of probe 110. In an embodiment, system controller 120 is in electrical communication with probe controller 122 to provide a control signal to probe controller 122 or to read data from probe controller 122. Test station 104 also can include position manipulator 124 disposed on chuck 108 to position wafer 102 relative to contactors 112 of probe 110. Position manipulator 124 can be interposed between test platform 104 and chuck 108.

Figure 6:
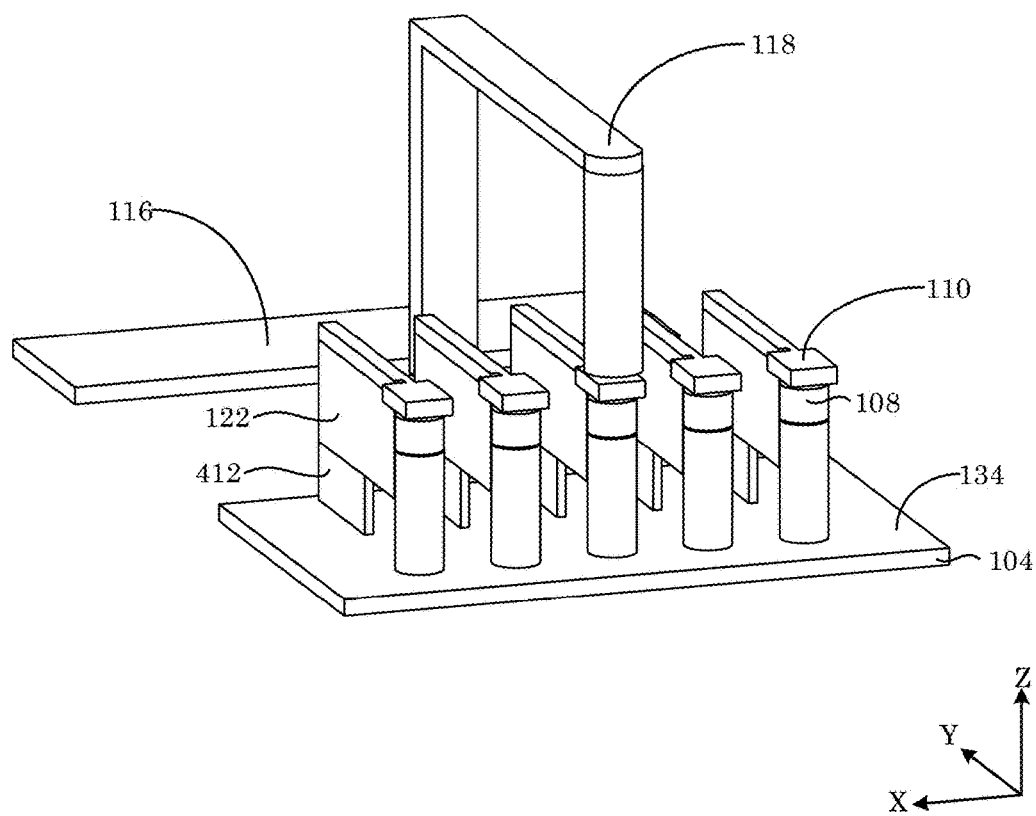
FIG. 6 shows a perspective view of a massively parallel wafer-level reliability system.
Figure 7:
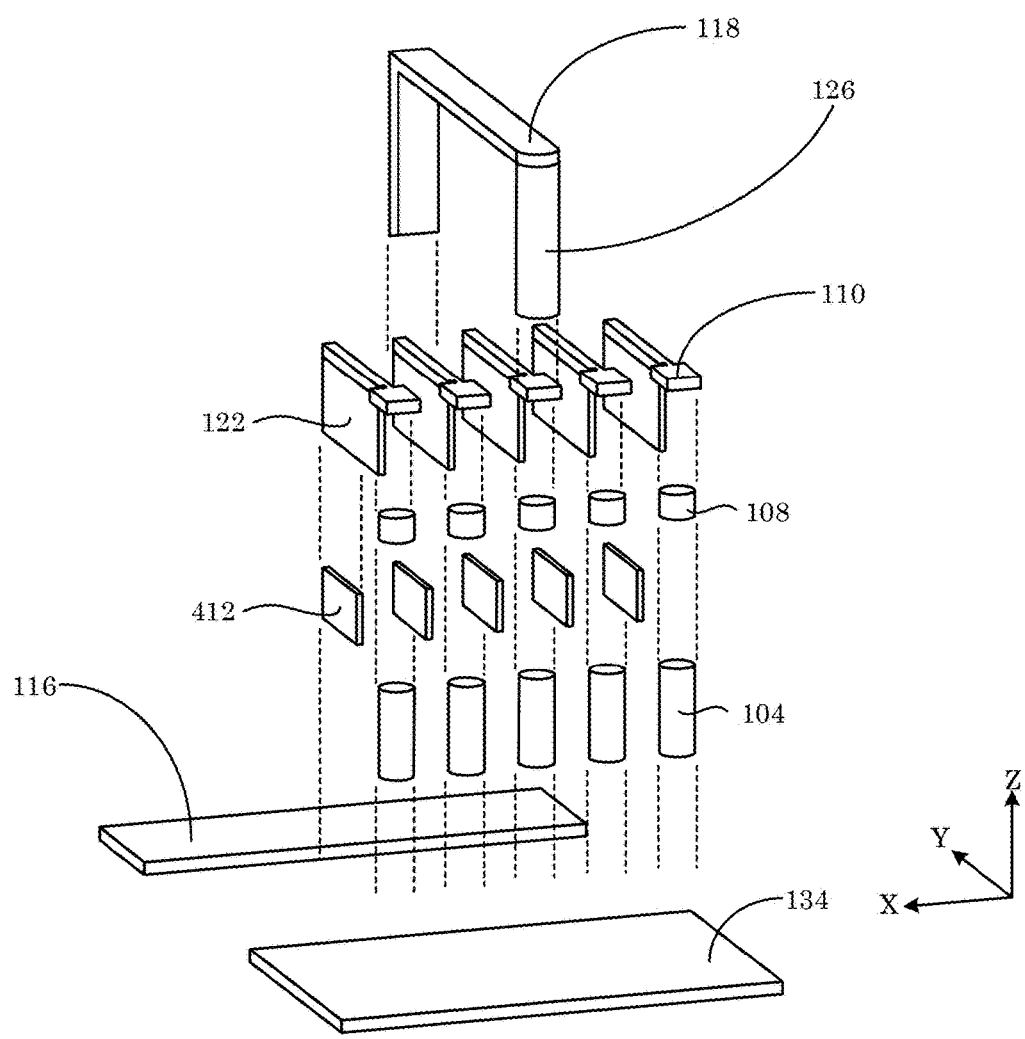
FIG. 7 shows an exploded view of the massively parallel wafer-level reliability system shown in FIG. 6.
Figure 8:
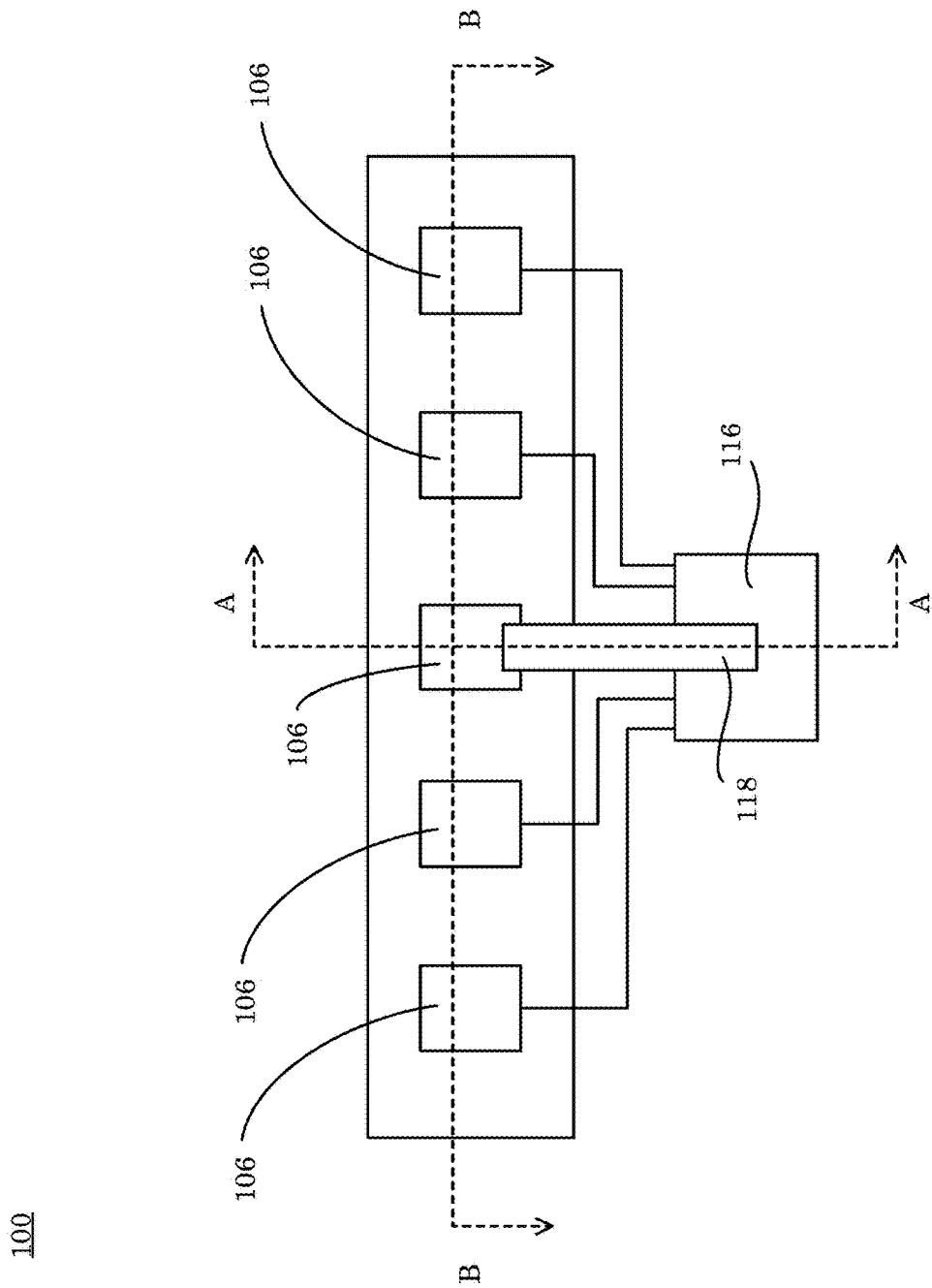
FIG. 8 shows a top view of the massively parallel wafer-level reliability system shown in FIG. 6.
Figure 9:
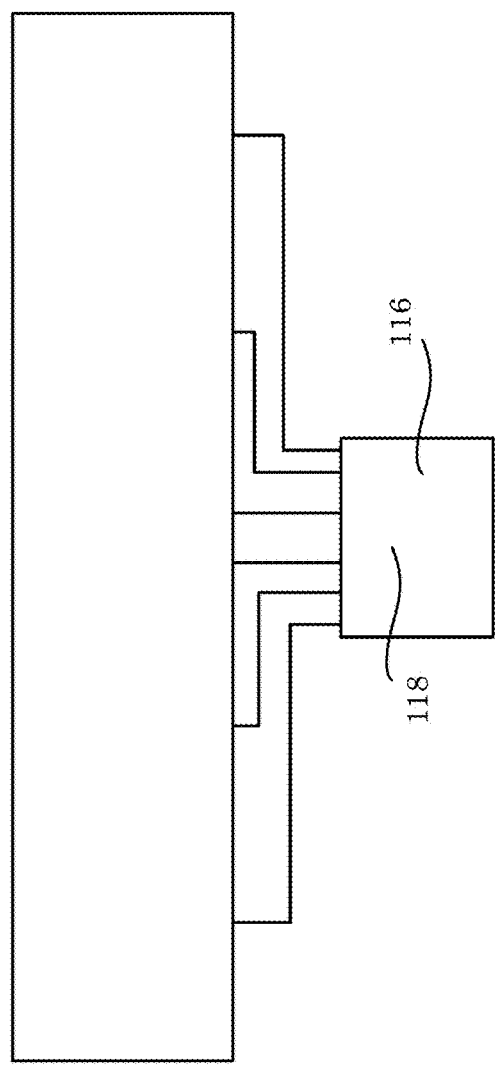
FIG. 9 shows a bottom view of the massively parallel wafer-level reliability system shown in FIG. 6.
Figure 10:
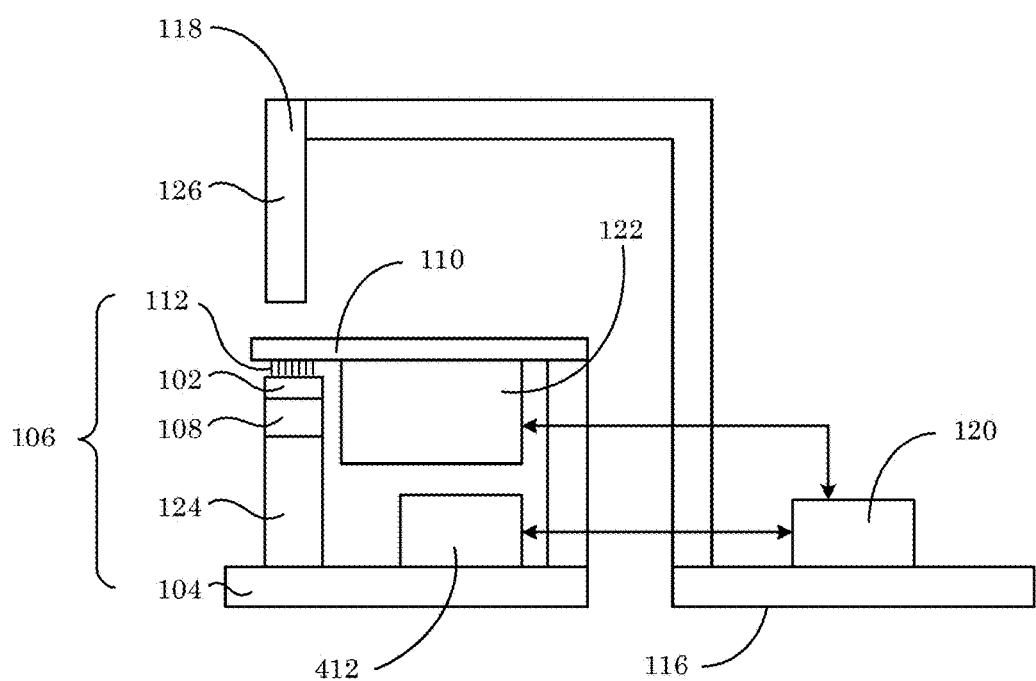
FIG. 10 shows a cross-sectional view along line A-A of the massively parallel wafer-level reliability system shown in FIG. 8.
Figure 11:
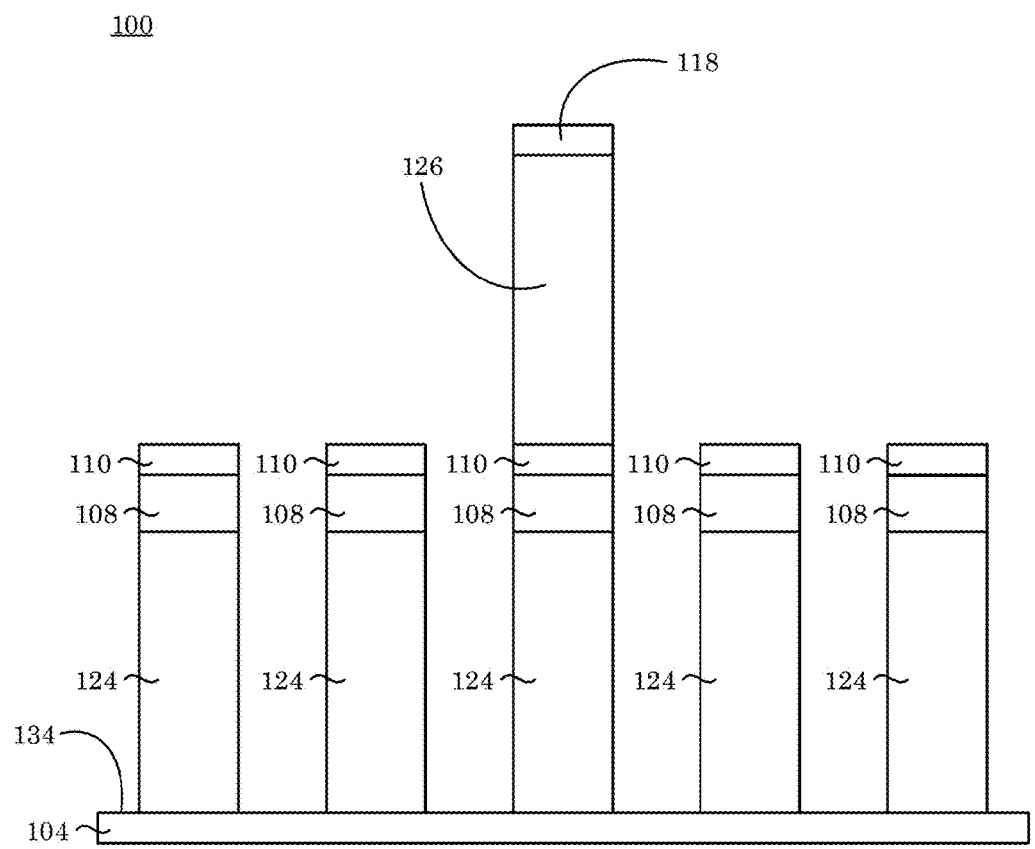
FIG. 11 shows a cross-sectional view along line B-B of the massively parallel wafer-level reliability system shown in FIG. 8.

According to an embodiment, with reference to FIG. 6 (perspective view), FIG. 7 (exploded view), FIG. 8 (top view) FIG. 9 (bottom view), FIG. 10 (cross-sectional view along line A-A shown in FIG. 8), massively parallel wafer-level reliability system 100 includes test platform 104; a plurality of test stations 106 disposed on test platform 104, wherein individual test station 106 receives wafer 102 of the plurality of wafers and includes: chuck 108 disposed on test platform 104 to receive wafer 102; probe 110 including a plurality of contactors 112, contactors 112 to electrically contact wafer 102 disposed on chuck 108; and temperature controller 114 disposed on chuck 108 to control a temperature of wafer 102 disposed on chuck 108; control platform 116 disposed among the plurality of test stations 106, test platform 104 and control platform 116 having relative motion such that test stations 106 are selectively positioned with respect to a location of fiduciary 118 disposed on control platform 116; and system controller 120 to independently control test stations 106 and in electrical communication with temperature controller 114, wherein the reliability of wafers 102 is tested in parallel by test stations 106. Here, relative motion between control platform 116 and test stations 106 disposed on test platform 104 is substantially linear motion.

Test platform 104 is a substrate on which test station 106 is disposed. Test platform 104 can be stationary or can move. In the case of motion of test platform 104, test platform can move in a direction that is linear, rotary, and the like. A motion or position of test platform 104 can be indexed to fiduciary 118 disposed on control platform 116 or to an external index, i.e., external to control platform 116.

A shape and size of test platform 104 provides support for test stations 106. The shape can be round, rectangular, and the like. The size, e.g. a width, height, length, diameter, or the like independently can be 15 inches, 50 inches, and the like. A thickness can be from ¼ inch to 10 inches, specifically from ¼ inch to 2 inches, and more specifically from ½ inch to 1 inch.

Test platform 104 can be a monolithic structure or can be a composite of multiple pieces. A material used to fabricate test platform 104 can be any material that will structurally support while not interfering with the functionality of the plurality of test stations 106 and can include metals, plastics, polymers, glasses, ceramics, and the like, or a combination thereof. In an embodiment, test platform 104 is metal, e.g., aluminum.

Figure 12:
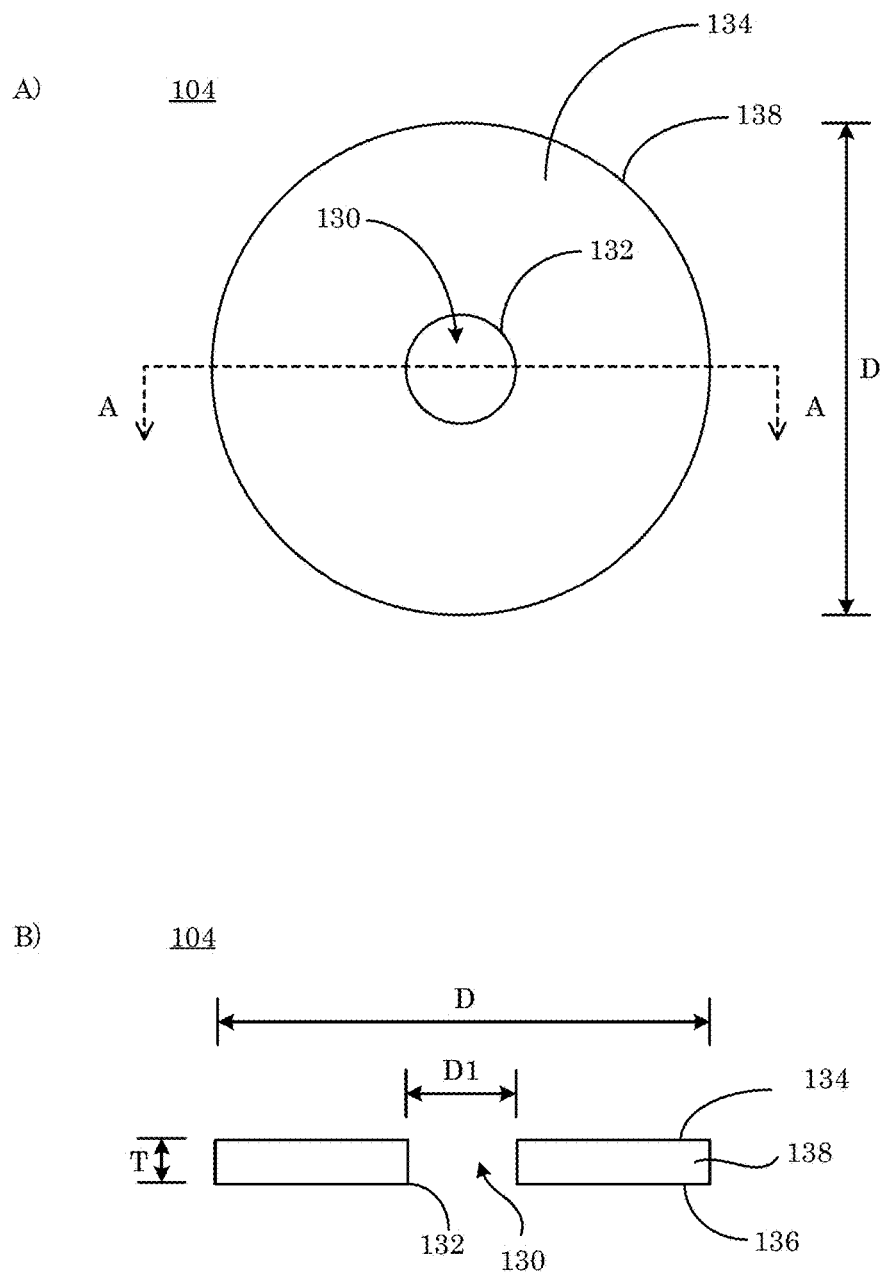
FIG. 12 shows (panel A) a top view of a test platform and (panel B) cross-sectional view along line A-A shown in the top view.

In an embodiment, with reference to FIG. 12 (top view in panel A, cross-sectional view in panel B), test platform 104 has a circular shape with diameter D and thickness T. First surface 134 opposes second surface 136 and is bounded outer periphery 138 and inner wall 132. Opening 130 is bounded by inner wall 132 and spans thickness T. In some embodiments opening 130 is a blind opening. In a certain embodiment, opening 130 is through opening as shown in FIG. 12. Test stations 106 are disposed on first surface 134 and can be, fixedly disposed thereon or can be removably disposed. Opening 130 provides for communication of wiring and other elements therethrough. In a embodiment, test platform 104 can be arranged such that control platform 116 is disposed in opening 130.

Test platform 104 can be disposed on an underlying substrate or control platform 116. In an embodiment, test platform 104 is disposed on the underlying substrate and is subjected to being moved mechanically through gears, bearings, and the like, which can be interposed between test platform 104 and the underlying substrate. The motion can be automated or manual. A stepper motor can be in mechanical communication with test platform 104 to provide movement to test platform 104. The stepper motor can be indexed to or controlled by system controller 120. Indexing can be with respect to an index position of control platform (e.g., a home position) with respect to fiduciary 118 of control platform 116. The underlying substrate for test platform 104 can be, e.g., a floor, table, bench, rack, and the like. Since wafer 102 and contactors 112 are disposed together in test station 106 that is disposed on test platform 104, test platform 104 can be vibrationally isolated (e.g., dampening vibrations of test platform 104) or not.

Figure 13:
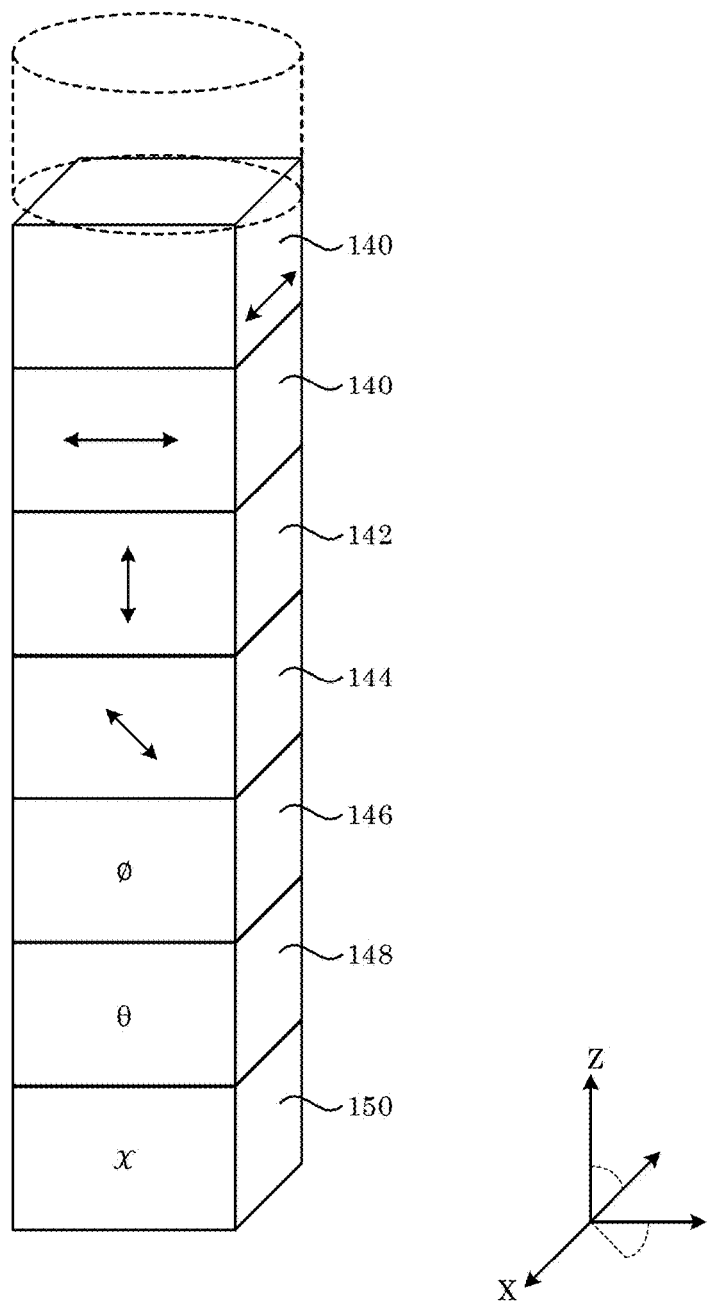
FIG. 13 shows a side view of a position manipulator.

In an embodiment, with reference to FIG. 13, position manipulator 124 positions wafer 102 relative to contactors 112 of probe 110. Position manipulator 124 can move wafer 102 in one degree of freedom or a plurality of degrees of freedom, e.g., two, three, four, five, six, or seven degrees of freedom. According to an embodiment, position manipulator 124 provides control of movement of wafer 102 in six degrees of freedom such as three degrees of freedom for rotation of wafer 102 that includes roll rotation, yaw rotation, and pitch rotation; and three degrees of freedom for translation of wafer 102 that includes x-translation, y-translation, and z-translation, wherein x, y, and z are mutually orthogonal axes. The degrees of freedom can include four translational axes for translational movement of wafer 102 along mutually orthogonal x-, y-, and z-coordinate axes, and three rotational axes for roll-, pitch-, and yaw-rotations of wafer 102 about x-, y-, and z-axes, respectively. The four translational axes can include a redundant translational axis for translational movement of wafer 102. In some embodiments, the eight degrees of freedom include five translational axes for translational movement of wafer 102 along mutually orthogonal x-, y-, and z-coordinate axes, and three rotational axes for roll-, pitch-, and yaw-rotations of wafer 102 about x-, y-, and z-axes, respectively. In an embodiment, the degrees of freedom can include three independent translational axes for translational movement of wafer 102 along mutually orthogonal x-, y-, and z-coordinate axes, and three independent rotational axes for roll-, pitch-; yaw-rotations of wafer 102 about x-, y-, and z-axes, respectively; and fine- or coarse-grained motion about the translational axes or rotational axes. According to an embodiment, chuck 108 is mounted on position manipulator 124 that includes a plurality of independent axes having degrees of freedom to align wafer 100 to contactors 112 of probe 110.

To provide motion along the degrees of freedom, it is contemplated that position manipulator 124 is a linear motion stage, rotary motion stage, tilt table, and the like. For movement in six degrees of freedom, position manipulator 124 can include three linear motion stages (140, 142, 144) and three rotary motion stages (146, 148, 150) disposed on one another such that position manipulator 124 is interposed between chuck 108 and test platform 104. In this arrangement of motion stages in position manipulator 124, the position of wafer 102 is controlled in every linear coordinate as well rotational coordinate of motion. In some embodiments, fewer than six degrees of freedom are manipulated by position manipulator 124. Here, the remaining degrees of freedom can be fixed when disposing sample 102 on chuck 108. It is contemplated that a number of motion stages provided in position manipulator 124 can be from 0 to 100, specifically from 0 to 20, more specifically from 0 to 10, further specifically from 0 to 6, and further more specifically from 0 to 3, wherein a number of linear motion stages or rotational motion stages is a subset of the number of motion stages. As used herein, "motion stage" refers to linear motion stage or rotational motion stage.

A shape and size of position manipulator 124 and individual motion stages is selected to provide support for chuck 108 and motion of wafer 102. The shape can be round, rectangular, and the like. The size (e.g., height, width, length, diameter, and the like) can be ½ inch, 2 inches, and the like. A thickness can be from ½ inch to 15 inches, specifically from 2 inches to 10 inches, and more specifically from 5 inches to 7 inches.

A range of motion of linear motion stage (e.g., 140, 142, 144) independently can be from ⅛ inch to 10 inches, specifically from ¼ inch to 6 inches, and more specifically from ½ inch to 3 inches. A range of motion of rotational motion stage (e.g., 146, 148, 150) independently can be from 3 degrees to multiples of 360 degrees, specifically from 5 degrees to 180 degrees, and more specifically from 5 degrees to 15 degrees. A slew rate of linear motion stage (e.g., 140, 142, 144) independently can be from 0.01 inch per minute to 600 inches per minute, specifically from 0.1 inch per minute to 120 inches per minute, and more specifically from 1 inch per minute to 20 inches per minute. A slew rate of rotational motion stage (e.g., 146, 148, 150) independently can be from 1 degree per minute to 2880 degrees per minute, specifically from 3 degrees per minute to 360 degrees per minute, and more specifically from 6 degrees per minute to 60 degrees per minute.

Position manipulator 124 can be a monolithic structure or can be a composite of multiple pieces, e.g., a plurality of motion stages. A material used to fabricate position manipulator 124 can be any material that will structurally support and manipulate a motion of wafer 102 disposed on chuck 108 and can include metals, plastics, polymers, glasses, ceramics, and the like, or a combination thereof. In an embodiment, test platform 106 is metal, e.g., aluminum.

Figure 14:
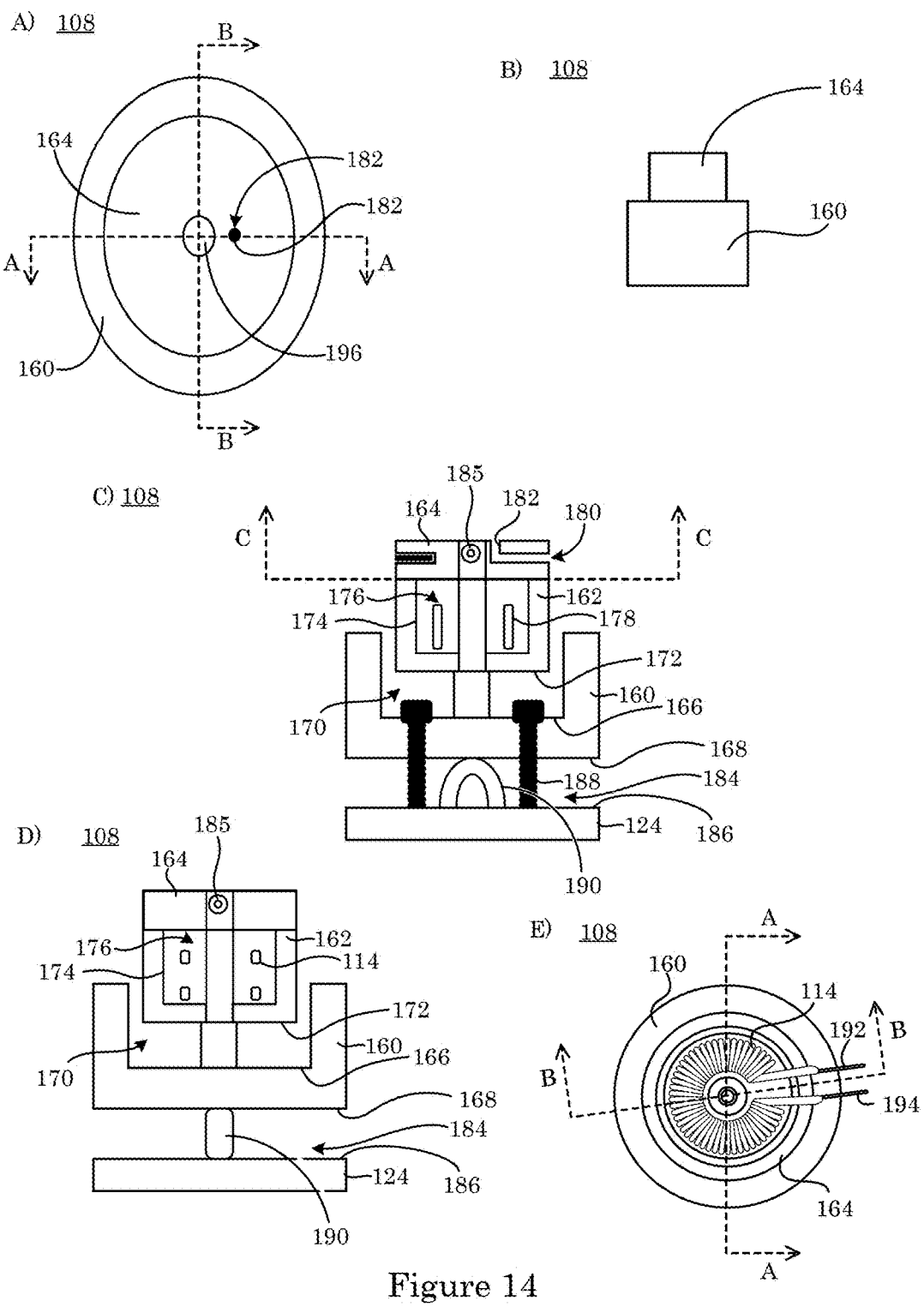
FIG. 14 shows (panel A) a top view of a chuck, (panel B) a side view of the chuck, (panel C) a cross-sectional view along line A-A shown in the top view, (panel D) cross-sectional view along line B-B shown in the side view, and (panel E) top view of the chuck from line C-C show in panel D.

In an embodiment, chuck 108 is disposed on test platform 104 and receives wafer 102 as shown in FIG. 14 in which panel A shows a top view of chuck 108; panel B shows a side view of chuck 108; panel C shows a cross-sectional view along line A-A shown in the top view; panel D shows a cross-sectional view along line B-B shown in the side view, and panel E shows a top view of chuck 108 from line C-C shown in panel D. Chuck 108 can be disposed on position manipulator 124 for positioning (i.e., alignment) of wafer 102 to contactors 112 of probe 110.

According to an embodiment, chuck 108 includes first airgap 170 interposed between surface 166 of first member 160 and surface 172 of second member 162. Spacer 190 fastens second member 162 to first member 160. First member 160 can be disposed on position manipulator 124 and coupled thereto with fastener 188 (e.g., a screw, bolt, and the like) and spaced apart therefrom with spacer 190 (e.g., a low thermal conductivity ring such as a ceramic ring). Here, surface 168 of first member 160 opposes surface 186 of position member 124 such that second airgap 184 is interposed between the first member 160 and position manipulator 124. First airgap 170 and second airgap 184 thermally insolate second member 162 and decrease heat transfer heat between position manipulator 124 and second member 162.

Temperature controller 178 can be disposed in compartment 176 of second member 162, wherein compartment 176 is bounded by wall 174. Second member 162 also includes lid 164. Lid 164 includes thermocouple 198 to monitor a temperature of chuck 108, terminal 185 through which a potential bias can be applied to wafer 102, and vacuum channel 180 bounded by wall 182 to provide a vacuum subjected to wafer 102 for mounting wafer 102 on lid 164.

A shape and size of chuck 108 is selected to provide support a mounting area for wafer 102. The shape can be round, rectangular, and the like. The size (e.g., height, width, length, diameter, and the like) can be ½ inch, 1 inch, and the like. A thickness can be from ⅛ inch to 1 inch, specifically from ⅛ inch to ½ inch, and more specifically from ⅛ inch to 3/16 inch.

Chuck 108 can be a monolithic structure or can be a composite of multiple pieces. A material used to fabricate chuck 108 can be any material that structurally supports and does not interfere with a functionality of wafer 102 and can include metals, plastics, polymers, glasses, ceramics, and the like, or a combination thereof. In an embodiment, chuck 108 is metal, e.g., copper or the like. According to an embodiment, second member 162 is made from a bronze-aluminum alloy and is thermally stable to 600° C. An electrical connector can be disposed on second member 162 to back contact bias wafer 102. In an embodiment, first member 160 includes stainless-steel, and standoff 196 is a ceramic standoff. Here, chuck 108 can be heated with power dissipation (e.g., 40 W) in temperature controller 114 in absence of thermal stress subjected to position manipulator 124 due to thermal isolation provided by air gaps, e.g., second airgap 184, first airgap 170, and the like.

Moreover, lid 164 of second member 162 of chuck 108 is made of a high thermal conductivity material for efficient heat transfer with temperature controller 114. Further, lid 164 is selected to have surface contact with wafer 102 disposed thereon such that lid 164 and wafer 102 are in thermal communication.

To heat or cool wafer 102 disposed on chuck 108, second member 162 of chuck 108 can include a heater, cooler, or a combination thereof as temperature controller 114. Exemplary heaters include infrared light, alumina coated heater wire, and the like. Exemplary coolers include thermal-electric cooler, flowing coolant, and the like. With reference to FIG. 14, temperature controller 114 can include the heater, wherein the heater is a coiled resistive wire covered by in electrically insulating material to isolate the heater from second member 162 and having electrical leads (192, 194) for communication of electrical current through the heater. A sufficient amount of electrical current can be communicated through the heater of temperature controller 114 to heat wafer 102 from 25° C. to 600° C., specifically from 30° C. to 450° C., and more specifically from 50° C. to 400° C. using the heater.

In an embodiment, temperature controller 178 includes the cooler (not shown) disposed on first 160 to cool wafer 102. Here, a sufficient amount of electrical current (e.g., in an electrical cooler), cooling fluid (e.g., in a fluidic cooler), or the like can be communicated through the cooler of temperature controller 114 to cool wafer 102 from 20° C. to −196° C., specifically from 15° C. to −100° C., and more specifically from 0° C. to −30° C. using the cooler.

Wafer 102 is disposed on chuck 108 such that wafer 102 is in thermal communication with chuck 108 for maintenance of a temperature of wafer 102. Wafer 102 includes standard semiconductor wafers of various materials and various sizes. Larger size wafers can be diced into smaller piece containing part of one or more than one repeated collection of circuits and devices to allow simultaneous use of multiple test stations 106. Exemplary wafers include Silicon, Gallium Nitride, and the like.

Figure 15:
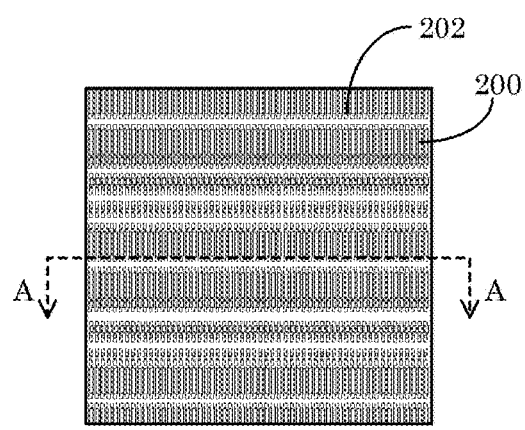
FIG. 15 shows (panel A) a top view of a wafer and (panel B) side view of the wafer.
Figure 15:
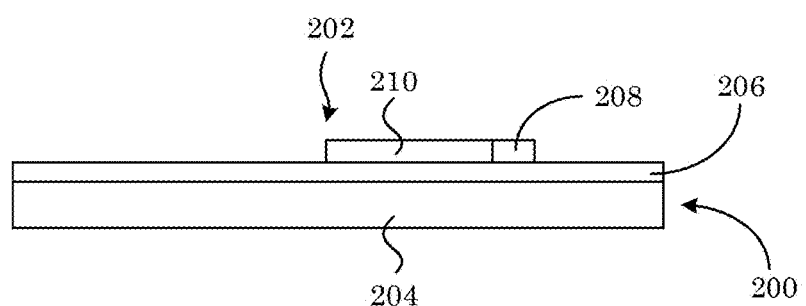
Figure 16:
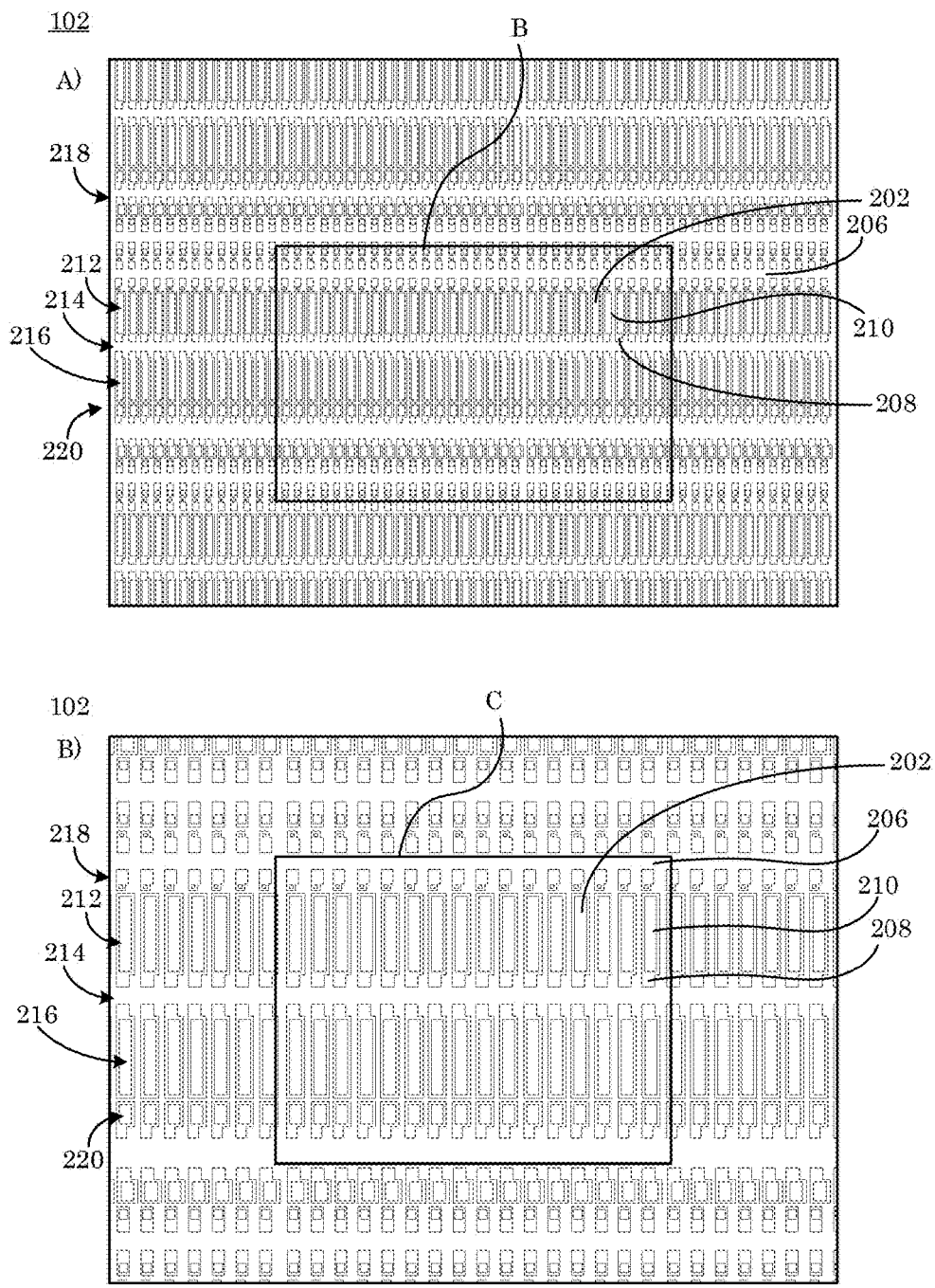
FIG. 16 shows (panel A) a zoomed top view of area A of the wafer shown in FIG. 15 and (panel B) a zoomed top view of area B of the wafer shown in panel A.
Figure 17:
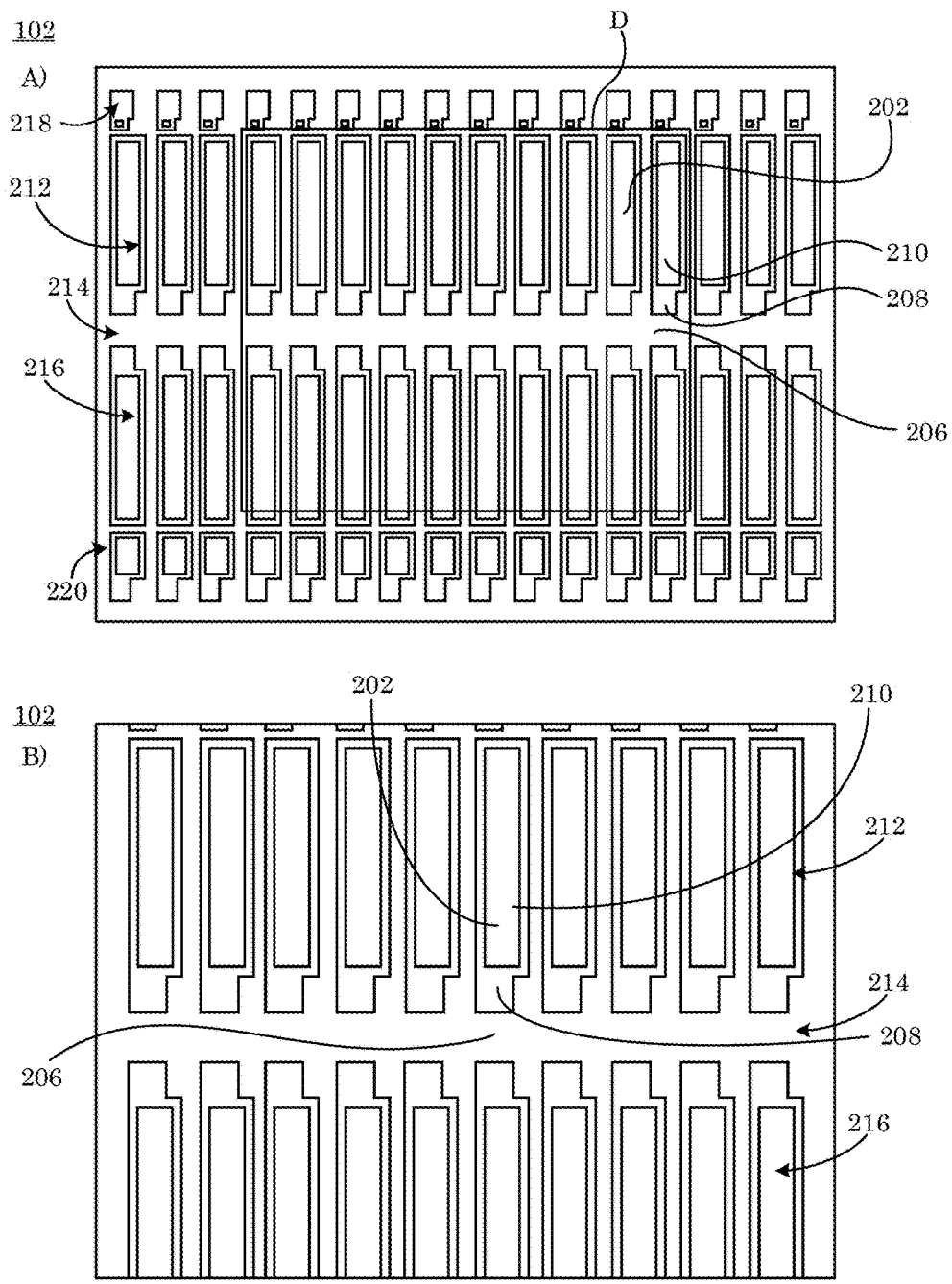
FIG. 17 shows (panel A) a zoomed top view of area C of the wafer shown in panel B of FIG. 16 and (panel B) a zoomed top view of area D of the wafer shown in panel A.

In an embodiment, with reference to FIG. 15 (in which panel A is a top view, and panel B is a side view), FIG. 16, and FIG. 17, wafer 102 includes substrate 200 on which a plurality of devices 202 are disposed. Here, dielectric layer 206 disposed on semiconductor layer 204. Device 202 is disposed on dielectric layer 206 and includes electrode 210 in electrical communication with contact pad 208. In combination, electrode 210, dielectric layer 206, and semiconductor layer 204 provide a capacitive structure arranged as a capacitor. A potential difference between electrode 210 and semiconductor layer 204 is present by subjecting semiconductor layer 204 to a first potential and subjecting semiconductor layer 204 to a second potential, wherein the first potential and second potential are different from one another. In an embodiment, the second potential is applied to electrode 210 via contact pad 208.

As shown in FIG. 16 (in panel A: zoomed top view of area A of wafer 102 shown in FIG. 15; and in panel B: a zoomed top view of area B of wafer 102 shown in panel A), FIG. 17 (in panel A: a zoomed top view of area C of wafer 102 shown in panel B of FIG. 16; and in panel B: a zoomed top view of area D of wafer 102 shown in panel A), wafer 102 includes devices 202 arranged in a plurality of separated rows. Here, first row 212 of devices 202 is separated by space 214 from second row 216 of devices 202, and third row 218 of devices 202 is proximate to first row 212. Fourth row 220 of devices 202 is proximate to second row 216.

Contactors 112 of probe 110 electrically contact devices 202 at contact pads 208.

Exemplary materials for semiconductors layer 204 include silicon, silicon carbide, and the like. Exemplary materials for dielectric layers 206 include silicon dioxide, hafnium oxide, and the like. Exemplary materials for electrode 210 and contact pad 208 independently include aluminum, titanium nitride, and the like.

Arranged as the capacitor, device 202 can have a capacitance from 0.1 femtofarad to 1 Farad, specifically from 1 femtofarad to 1 millifarad, and more specifically from 10 femtofarad to 1 microfarad. Arranged as a transistor, device 202 can have an active region from 5 nm×5 nm to 3 cm×3 cm, specifically from 10 nm×10 nm to 1 mm×0.1 mm, and more specifically from 10 nm×10 nm to 100 µm×10 µm.

Figure 18:
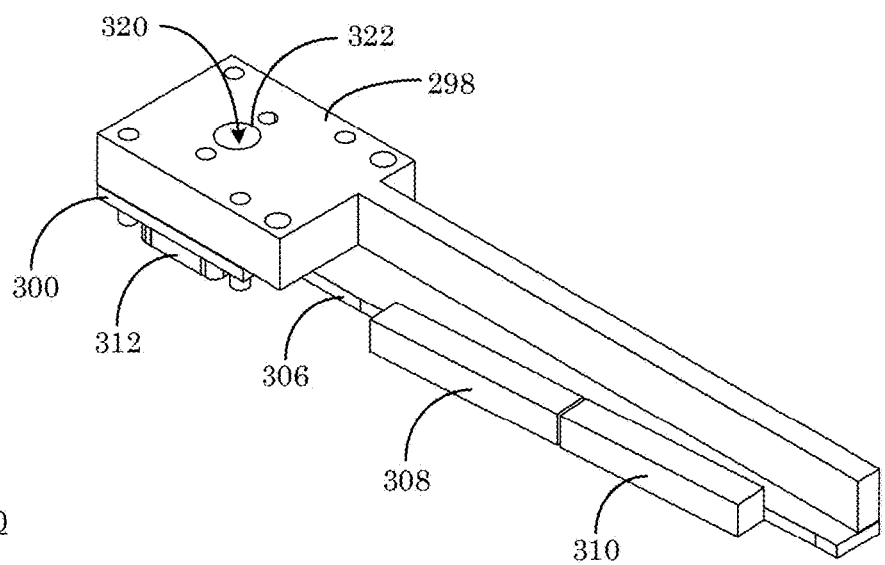
FIG. 18 shows (panel A) a perspective view of a probe and (panel B) an exploded view of the probe.
Figure 18:
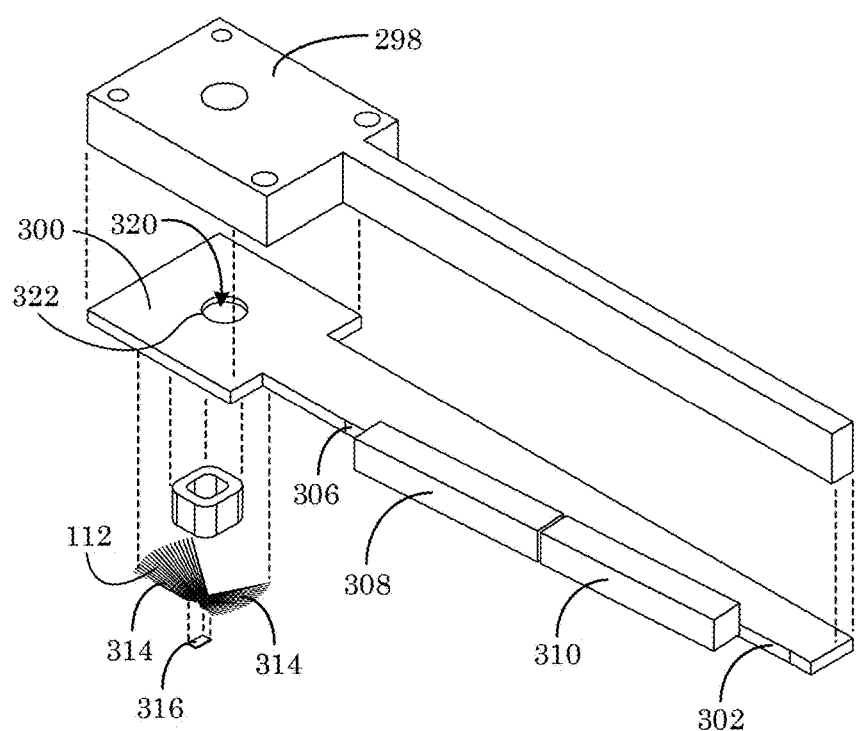
Figure 19:
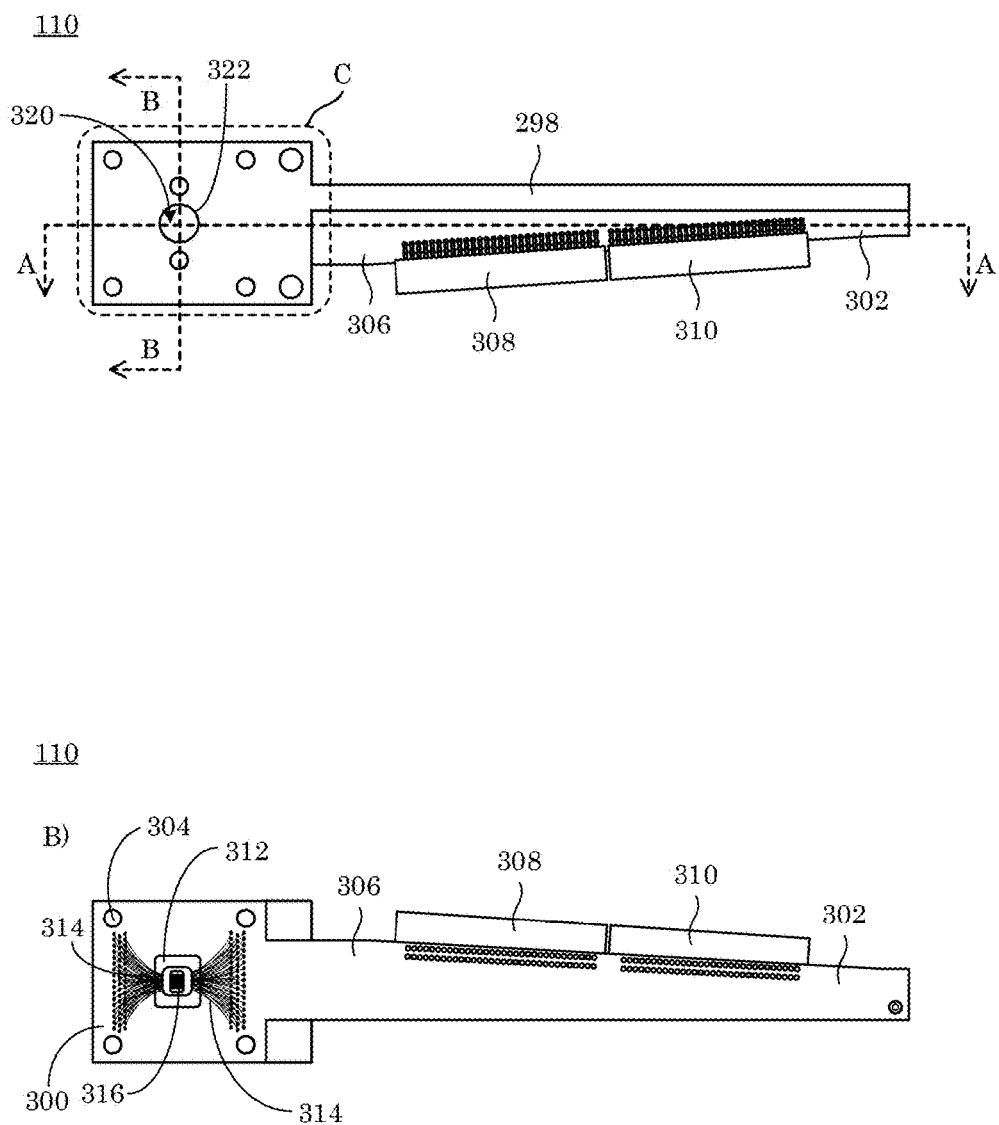
FIG. 19 shows (panel A) a top view of the the probe shown in FIG. 18, (panel B) a bottom view of the probe
Figure 20:
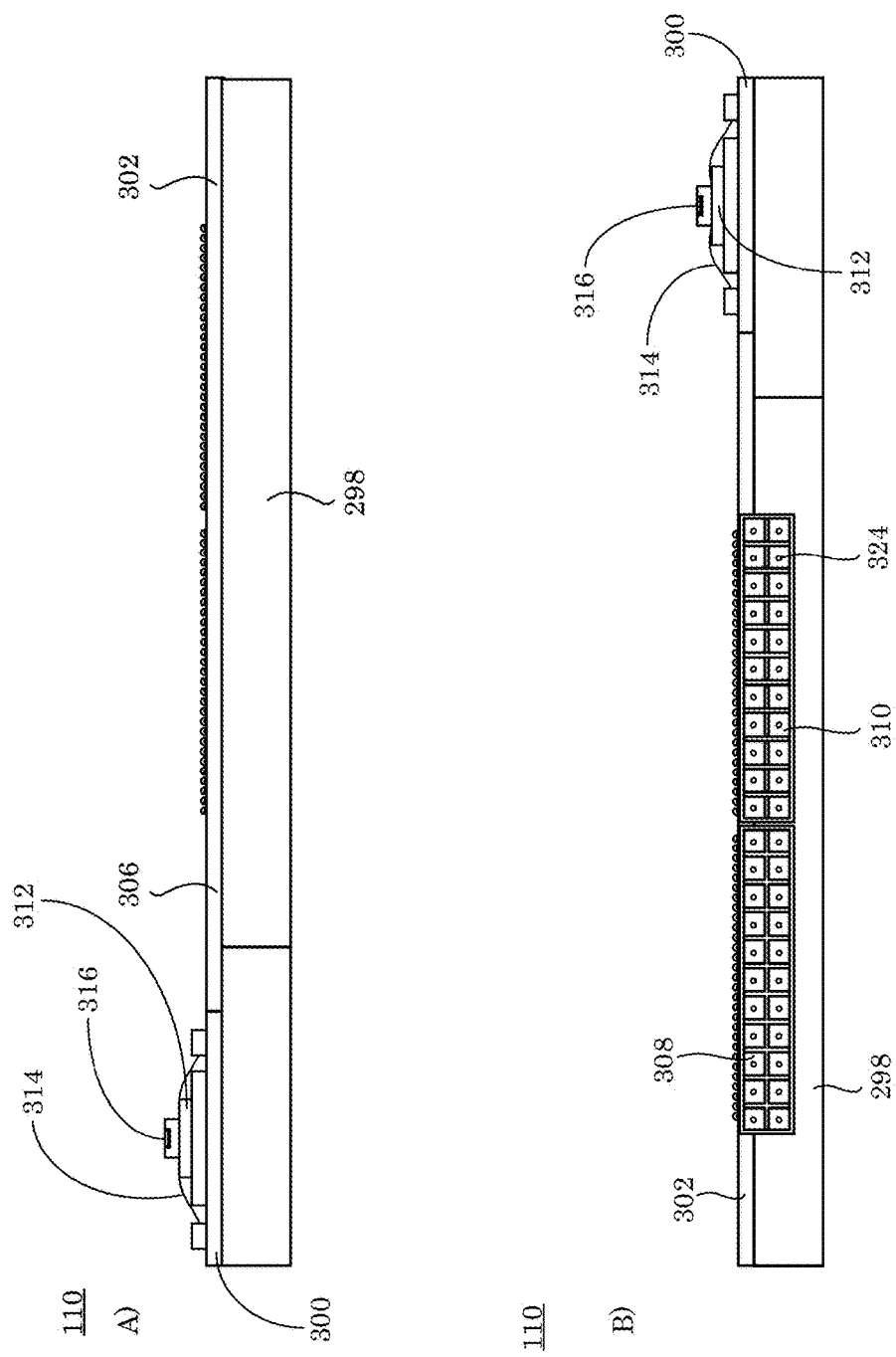
FIG. 20 shows (panel A) a first side view of the probe shown in FIG. 19, and (panel B) a second side view of the probe.
Figure 21:
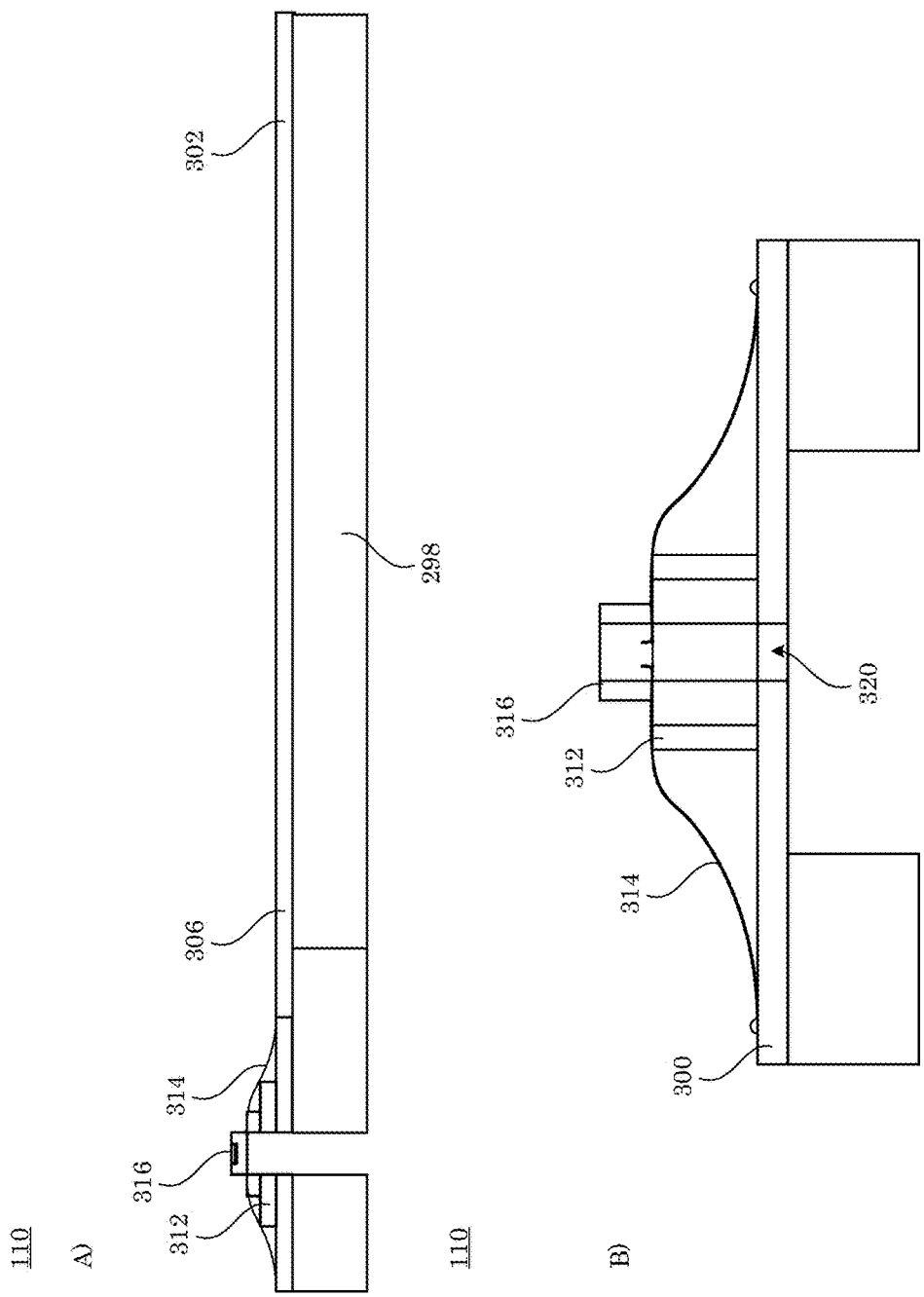
FIG. 21 shows (panel A) a cross-sectional view of the probe along line A-A shown in FIG. 19 and a cross-sectional view of the probe along line B-B shown in FIG. 19.
Figure 22:
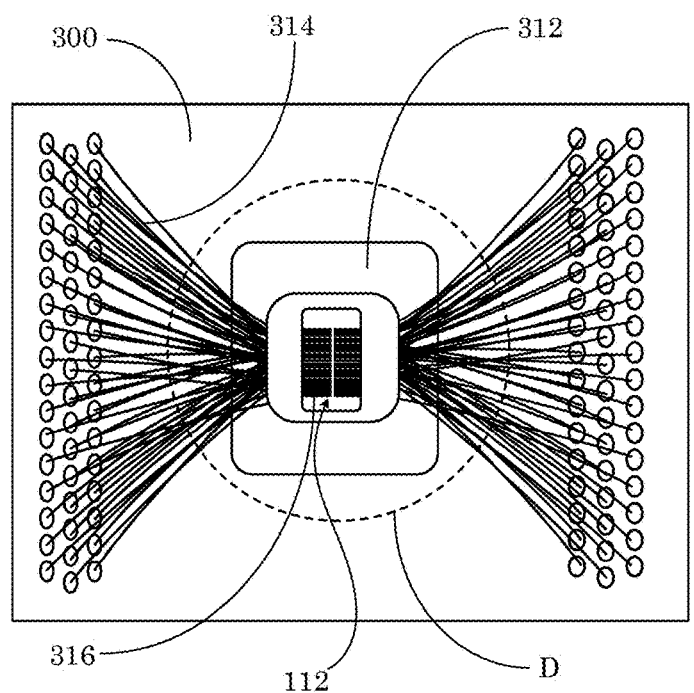
FIG. 22 shows a zoomed view of area C of the probe shown in FIG. 19.
Figure 23:
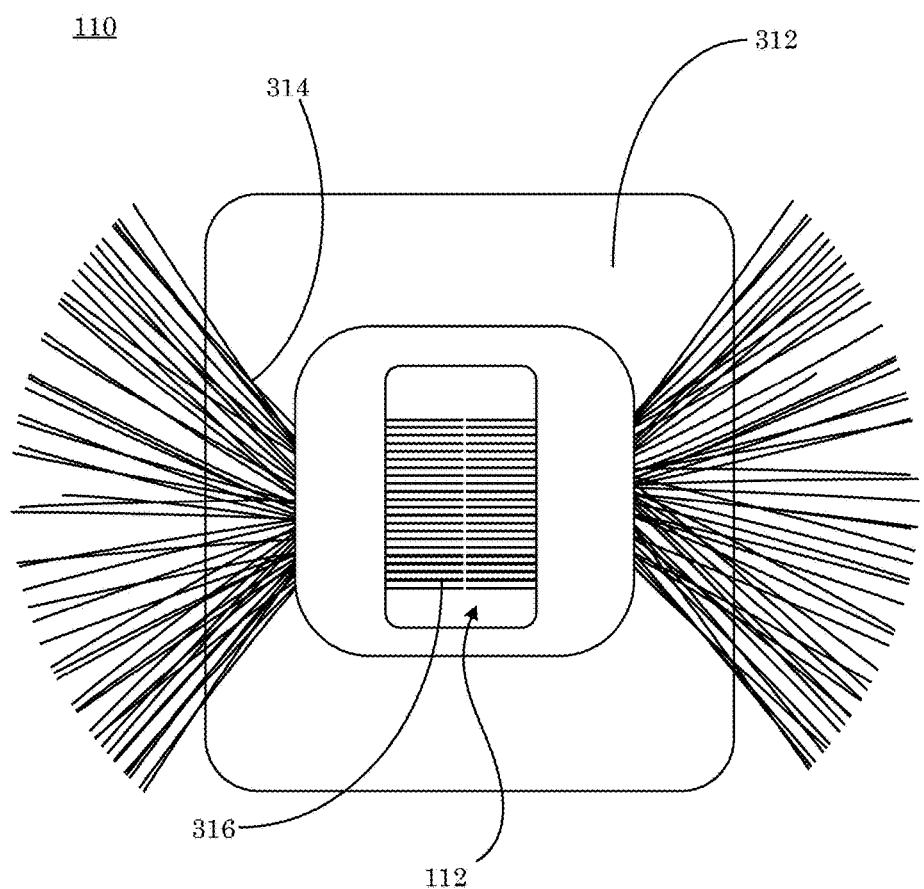
FIG. 23 shows a zoomed side view of area D of the probe shown in FIG. 22.

In an embodiment, with reference to FIG. 18 (panel A: a perspective view of probe 110; panel B: an exploded view of probe 110) and FIG. 19 (panel A: a top view of probe 110; panel B: a bottom view of probe 110), probe 110 includes of plurality of contactors 112 disposed in an array such that individual contactors 112 is arranged and positioned to individually align to and contact devices 202 at contact pads 208 on wafer 102. As also shown in FIG. 20, FIG. 21, FIG. 22, and FIG. 23, contactors 112 include conductor 314 proximate to first end 300 and terminate with tip 316. Tip 316 contacts contact pads 208. Conductor 314 runs in a direction parallel with first end 300 and tip 316 is perpendicular to the surface of first end 300 such that tip 316 is substantially parallel to contact pads 208 on wafer 102. At second end 302, connectors 308 and 310 receive electrical connection to probe controller 122. Connectors 308 and 310 or in electrical communication with conductors 314 of contactors 112, wherein individual tips 316 part selectively and individually addressed and controlled via respective conductor 314 through individual electrical connector 324 of connectors 308 and 310. In this manner, probe controller 122 communicates with tips 316 of contactors 112 to provide a test condition to wafer 102 in a reliability test of wafer 102. Exemplary connectors 308 and 310 include Amphenol FCI Rib-Cage™ MezzSelect™ Series 0.050" (1.27 mm) Pitch High Density Connectors.

Figure 24:
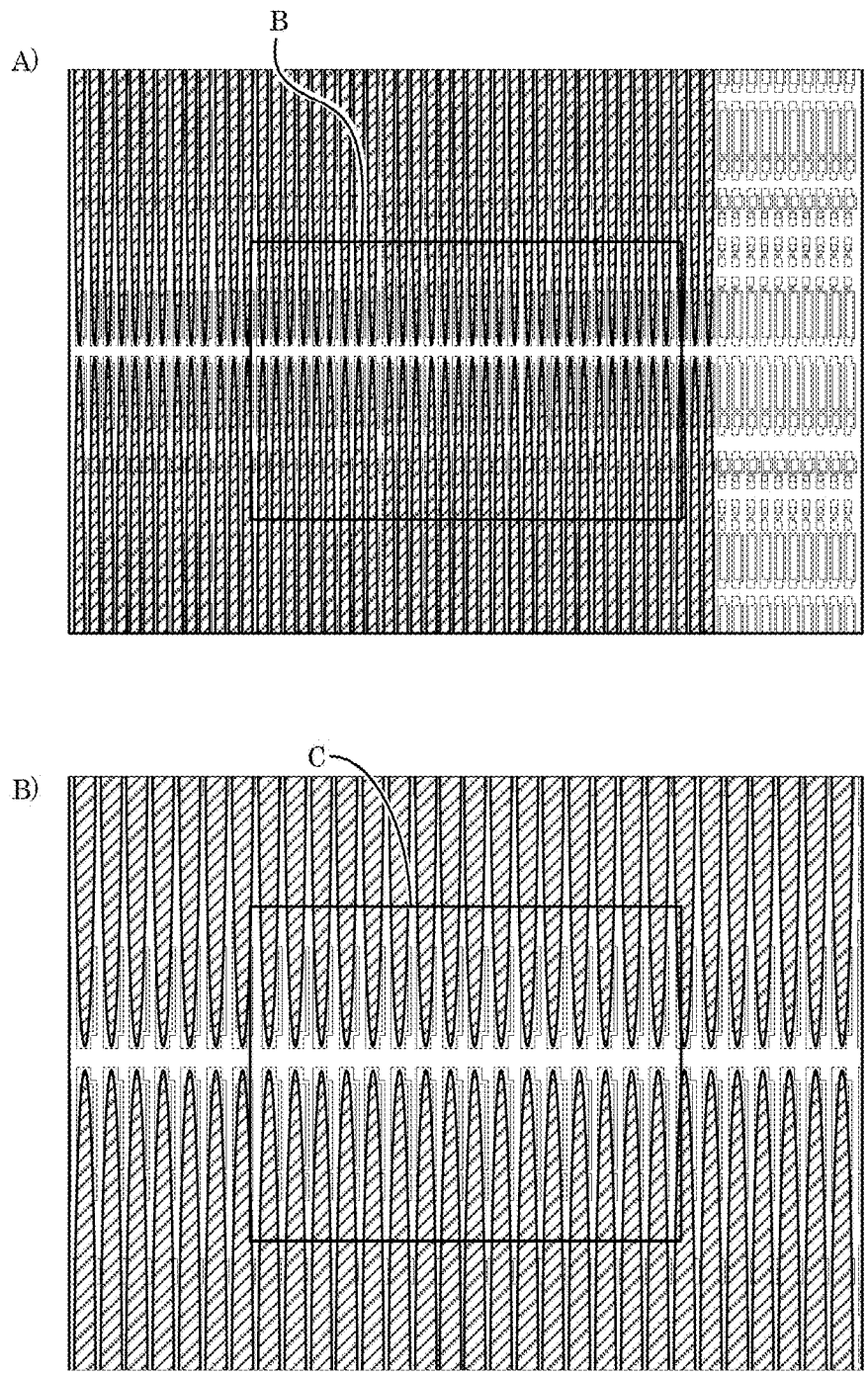
FIG. 24 shows (panel A) a zoomed top view of contactors in electrical contact with pads in area A of the wafer shown in FIG. 15 and (panel B) a zoomed top view of of area B marked in panel A.
Figure 25:
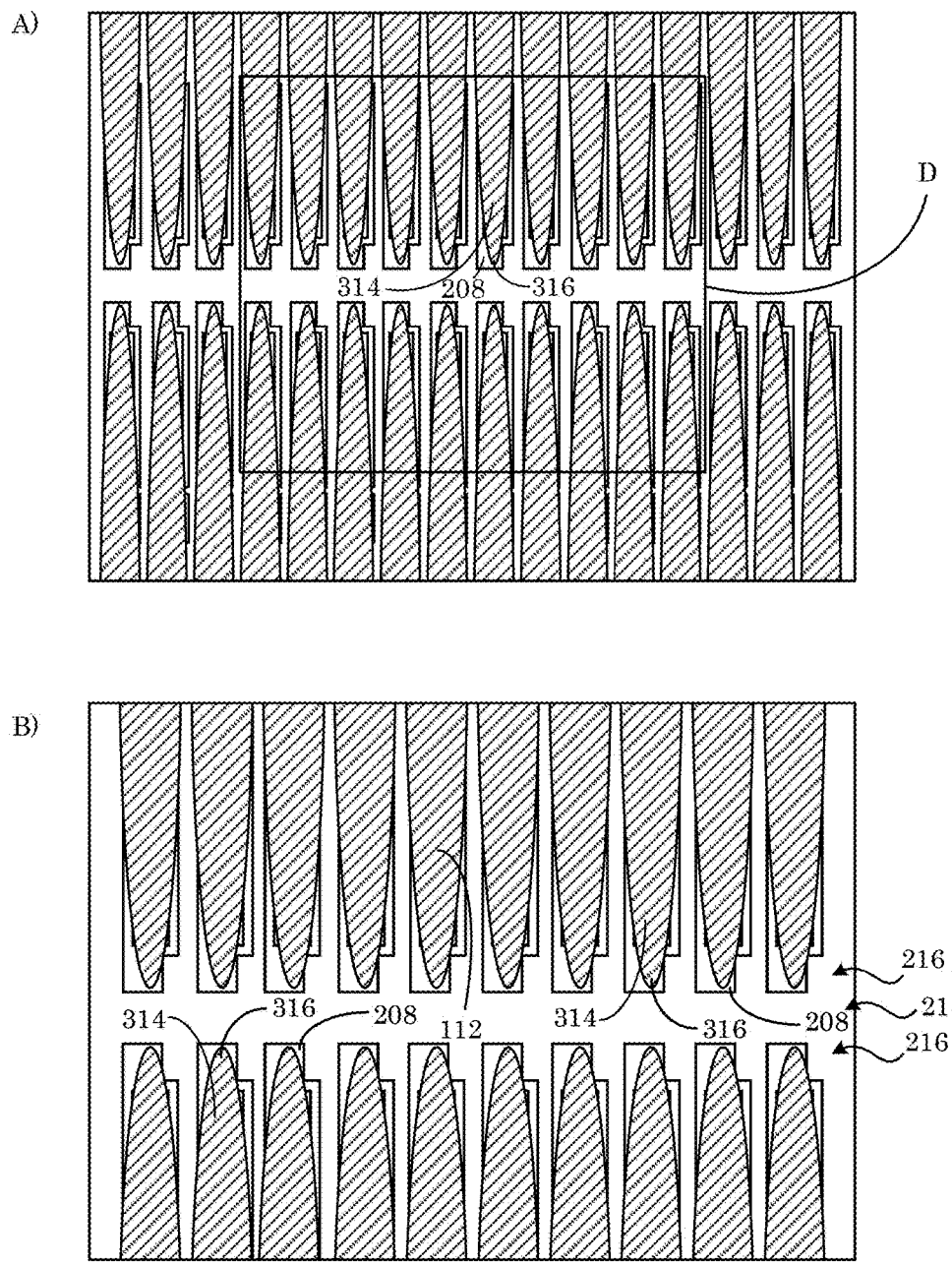
FIG. 25 shows (panel A) a zoomed top view of contactors in electrical contact with pads in area C marked in panel B of FIG. 24 and (panel B) a zoomed top view of area D marked in panel A.

Contactors 112 are aligned to contact pads 208 on wafer 102 by viewing a position of contactors 112 relative to contact pads 208 through window 322 that includes opening 320. FIG. 24 and FIG. 25 show zoomed views of contactors 112 aligned with and in contact with contact pads 208 of wafer 102. To maintain a fixed position of ends 316 relative to first end 300 and probe 110, holding member 312 is disposed on first end 300 to retain conductors 314 in place and stably holds pins 316 in position so that pins 316 are immobile as pins 316 contact and or in contact with contact pads 208 on wafer 102. Holding member 312 is also a heat sink for contactors 112 so that when wafer 102 is heated to a temperature that could damage components of probe 110, holding member 312 can transfer heat from contactors 112 to a thermal reservoir such as mounting member 298. It is contemplated that mounting member 298 efficiently transfers heat away from probe 110.

A number of contactors 112 can be selected for contact with contact pads 208. The number of contactors 112, e.g., can be from 4 to 400, specifically from 8 to 200, and more specifically from 12 to 100. A geometrical arrangement of tips 316 of contactors 112 include a plurality of rows, e.g., two rows of fifty contactors 112.

Exemplary materials for contactors 112 include tungsten, BeCu, and the like. Exemplary materials for first end 300 and second end 302 independently include copper alloy, gold-plated copper alloy, and the like. Exemplary materials for connectors 308 and 310 independently include polyimide, plastic, and the like.

In an embodiment, probe 110 is mounted on mounting member 298, which can be a material such as metal, plastic, polymer, ceramic, and the like. Attachment of probe 110 to mounting member 298 is via mounting holes 304 through probe 110. A fastener (e.g., a screw, adhesive, or the like) can be used to attach probe 110 to mounting member 298. Mounting member 298 can be disposed on test platform 104 so that probe 110 moves with test platform 104. In this manner, movement of probe 110 and chuck 108 are synchronized to motion of test platform 104, wherein chuck 108 can be moved relative to probe 110 by adjustment of position manipulator 124.

In an embodiment, probe 110 includes 100 contactors disposed and arranged in a 50×2 configuration, i.e., fifty tips 316 arranged in two rows. The tips can be arranged relative to contact pads 208 on wafer 102, which can be, e.g., 40×40 um$^2$ contact pads 208 with 80 µm pad pitch and 108 µm row pitch. Physical parameters such as spacing and size of contactors 112, e.g., tips 316, can be based on thermal expansion of contact pads 208 on wafer 102 as a function of temperature. It is contemplated that, under thermal expansion of wafer 102, contactors 112 remain in contact with contact pads 208 and do not exceed a size of contact pads 208.

In an embodiment, probe 110 is mounted on mounting member 298, and mounting member 298 is mounted to and disposed on test platform 104 that can be cooled, e.g., water-cooled. Provision of cooling to test platform 104 provides heat management to probe 110 to increase an operating temperature limit for probe 110. At the wafer-level, a high temperature capability of probe 110 provides acceleration of stress to wafer 102 in an absence of aggressive voltage acceleration applied to wafer 102.

Figure 26:
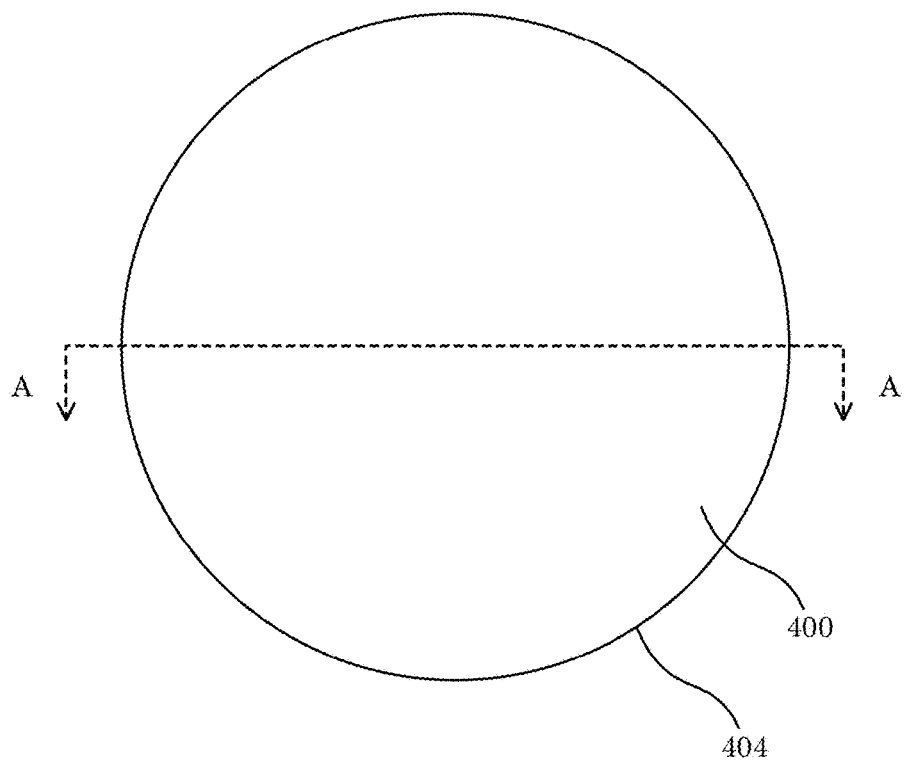
FIG. 26 shows (panel A) a top view of a control platform and (panel B) cross-sectional view along line A-A shown in the top view.
Figure 26:
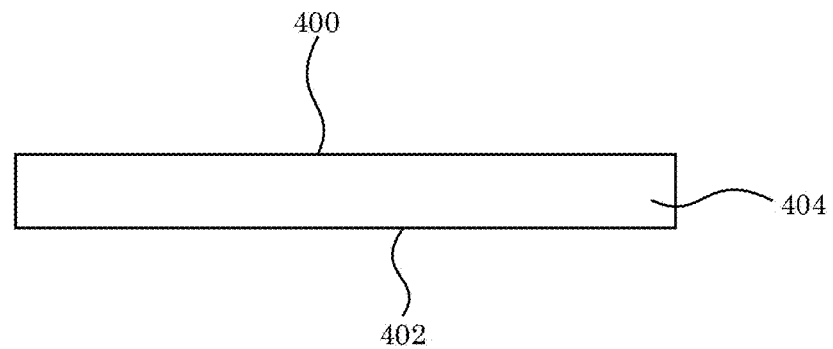

In an embodiment, with reference to FIG. 26, control platform 116 is a substrate on which fiduciary 118 is disposed. Control platform 116 can be stationary or can move. In the case of motion of control platform 116, control platform 116 can move in a direction that is linear, rotary, and the like. A motion or position of control platform 116 can be used to index a position of test platform 106 through the fiduciary 118, which and can be used index a home position of test platform 106 and to align contactors 112 to device 202 on wafer 102.

A shape and size of control platform 116 provides support for optical microscope and computer. The shape can be round, rectangular, and the like. The size, e.g. a width, height, length, diameter, or the like independently can be 5 inches, 10 inches, and the like. A thickness can be from ¼ inch to 3 inches, specifically from ¼ inch to 2 inches, and more specifically from ½ inch to 1 inch.

Control platform 116 can be a monolithic structure or can be a composite of multiple pieces. A material used to fabricate control platform 116 can be any material that will structurally support while not interfering with the functionality of the plurality of test stations 106 or test platform 104 and can include metals, plastics, polymers, glasses, ceramics, and the like, or a combination thereof. In an embodiment, control platform 116 is metal, e.g., aluminum.

In an embodiment, with reference to FIG. 26 (top view in panel A, cross-sectional view in panel B), control platform 116 has a circular shape with diameter D and thickness T. First surface 400 opposes second surface 402 and is bounded outer periphery 404. In some embodiments, test platform 104 in test stations 106 are disposed around control platform 116.

Control platform 116 can be disposed on an underlying substrate. In an embodiment, control platform 116 is disposed on the underlying substrate and is subjected to being moved mechanically through gears, bearings, and the like, which can be interposed between control platform 116 and the underlying substrate. Motion of control platform 116 can be automated or manual. A stepper motor can be in mechanical communication with control platform 116 to provide movement to control platform 116. The stepper motor can be indexed to or controlled by system controller 120. Indexing can be with respect to an index position of control platform (e.g., a home position) with respect to fiduciary 118 disposed on control platform 116. The underlying substrate for control platform 116 can be identical to or different from that of test platform 104 and can be, e.g., a floor, table, bench, rack, and the like.

Fiduciary 118 is disposed on control platform 116 to provide an indication of a relative position of test station 106 to control platform 116. Fiduciary 118 can be, e.g., an optical microscope, index marking, mechanical arm, projection, indention, position encoder, and the like.

Figure 27:
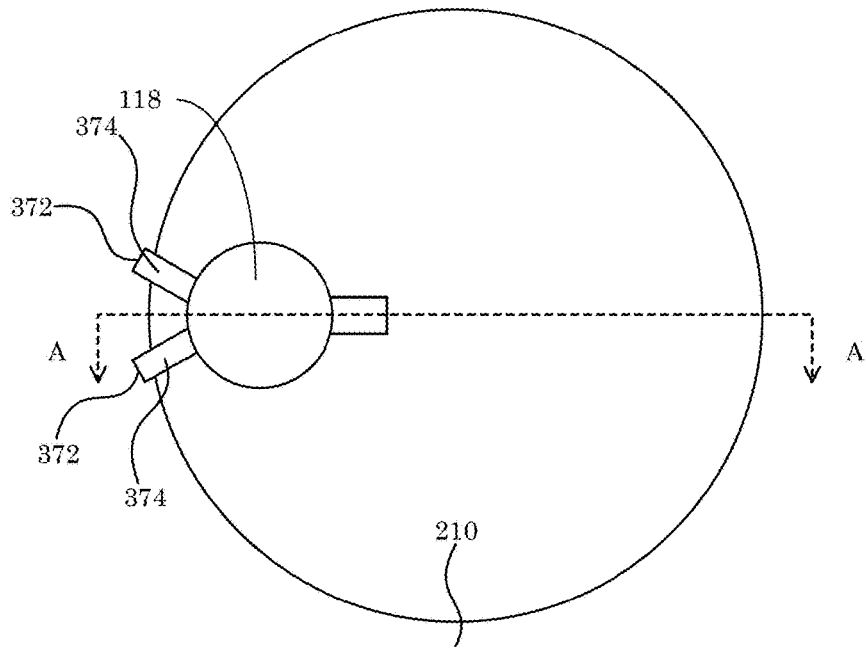
FIG. 27 shows (panel A) a top view of a fiduciary disposed on a control platform and (panel B) cross-sectional view along line A-A shown in the top view.
Figure 27:
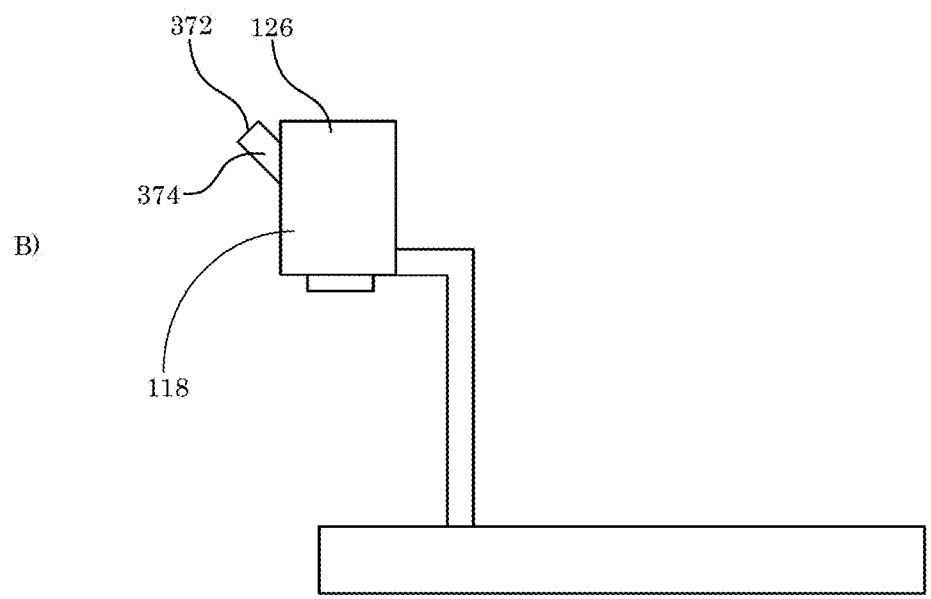

In an embodiment, as shown in FIG. 27, fiduciary 118 is optical microscope 126 that includes a plurality of lenses 372, ocular 374, and the like. Here, the optical microscope is used to optically align pins 316 of contactors 112 to contact pads 208 of wafer 102. Such alignment can be performed with human vision or machine vision. For machine vision, control of such alignment can occur under control of system controller 120 that can be in electrical communication with position manipulator 124 of test station 106 disposed on test platform 104.

Electronic components (e.g., probe controller 122, thermal controller 412, system controller 120, and the like) included in massively parallel wafer-level reliability system 100 provide control of stress conditions, such as temperature, voltage, current of the devices under test, as well as to measure the responses of the devices, such as voltage, current, individually and accurately under specific measurement condition that can be different from the stress condition. The measured results can be communicated to the computer for storage.

In an embodiment, massively parallel wafer-level reliability system 100 includes thermal controller 412, in electrical communication with temperature controller 114 disposed in chuck 108 of test station 106. Thermal controller 412, electronically controlled a function of temperature controller 114, e.g., the heater or cooler, disposed in chuck 108. Thermal controller 412 can be disposed on test platform 104 proximate to its test station 106. Thermal controller 412 can provide a plurality of control signals and receive feedback from temperature controller 114, thermocouple 198, and the like. In an embodiment, thermal controller 412 electric current to temperature controller 114 so that temperature controller 114 heats chuck 108 and wafer 102 disposed thereon.

Exemplary thermal controllers include PID devices (commercially available, e.g., as Omega CNi3252-C24, Fuji Electric PXR3, and the like). In an embodiment, thermal controller 412 includes a proportion integral derivative (PID) device to control or maintain the temperature of chuck 108.

Figure 28:
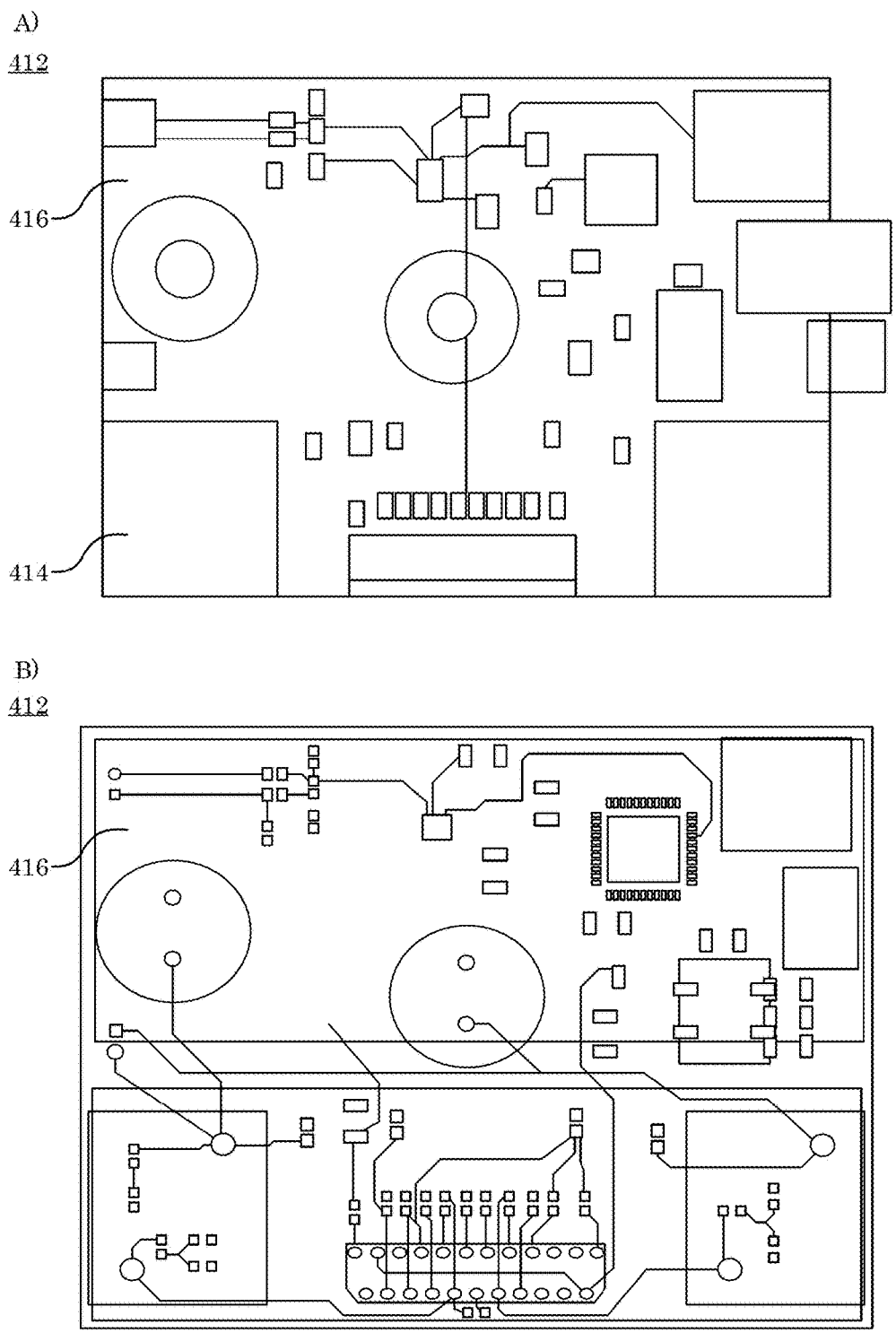
FIG. 28 shows (panel A) a first side view of a thermal controller and (panel B) a second side view of the thermal controller.

In an embodiment, with reference to FIG. 28, thermal controller 412 includes a plurality of electrical components 414 disposed on printed circuit board 416. Electrical components 414 can include amplifier to amplify the temperature sensor input, analog to digital converter to convert the temperature reading to digital format, microcontroller to process the digital signal and perform the PID function, digital to analog converter to convert the microcontroller output to analog signal, class D amplifier to amplify the analog output to drive the heating element, output filter to eliminate switching noise of the class-D amplifier, and the like.

Figure 29:
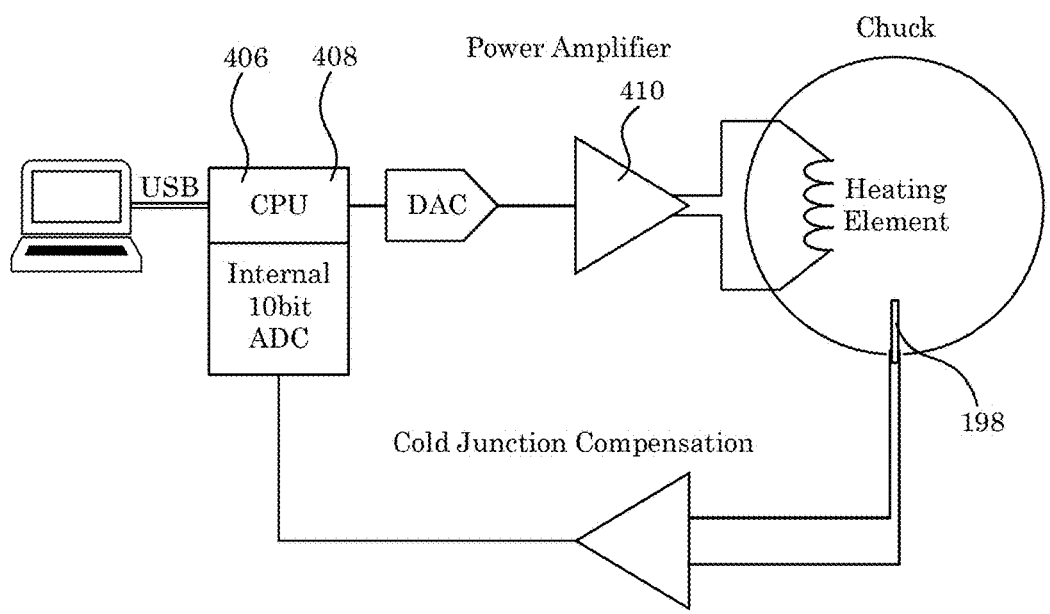
FIG. 29 shows a schematic of the thermal controller shown in FIG. 28.

In an embodiment, as shown in FIG. 29, thermal controller 412 includes PID 406 to control temperature, microcontroller 408 to receive a stress temperature condition from system controller 120 and to receive electrical signal from thermocouple 198 in chuck 108. Microcontroller 408 determines whether to send power to temperature controller 114. The power is generated from audio amplifier 410. Advantageously, audio amplifier 410, e.g., an energy efficient class-D amplifier, providing power to heat chuck 108 without radiatively dissipating a large amount of power as heat into printed circuit board 416 of thermal controller 412 and reduces energy consumption of massively parallel wafer-level reliability system 100 to avoid power waste. Additionally, pulse width modulation (PWM) is embedded in audio amplifier 410, and output signal from audio amplifier 410 is filtered on-board thermal controller 412 that provides a DC component in the current applied to temperature controller 114. As a result, electrical noise produced by thermal controller 412 is reduced relative to an architecture of thermal controller 412 without this electrical configuration.

In an embodiment, massively parallel wafer-level reliability system 100 includes probe controller 122 in electrical communication with probe 110 disposed on test platform 104 in individual to stations 106. Probe controller 122 electronically controls a function of probe 110, e.g., contactors 112. Probe controller 112 can be disposed on probe 110. Probe controller 122 provides a plurality of control signals and receives feedback from contactors 112. In an embodiment, probe controller 122 provides voltage or electric current to contactors 112 so that contactors 112 provide a stress to wafer 102 including devices 202 disposed thereon.

Exemplary probe controllers include circuitry to provide waveforms of control voltage or current, which can be AC, DC, or a combination thereof. Electrical components for the probe controller can include commercially available components such as Agilent B1500, Agilent 4156B, and the like. In an embodiment, probe controller 122 includes voltage or current source to control or maintain voltage or current applied to wafer 102.

Figure 30:
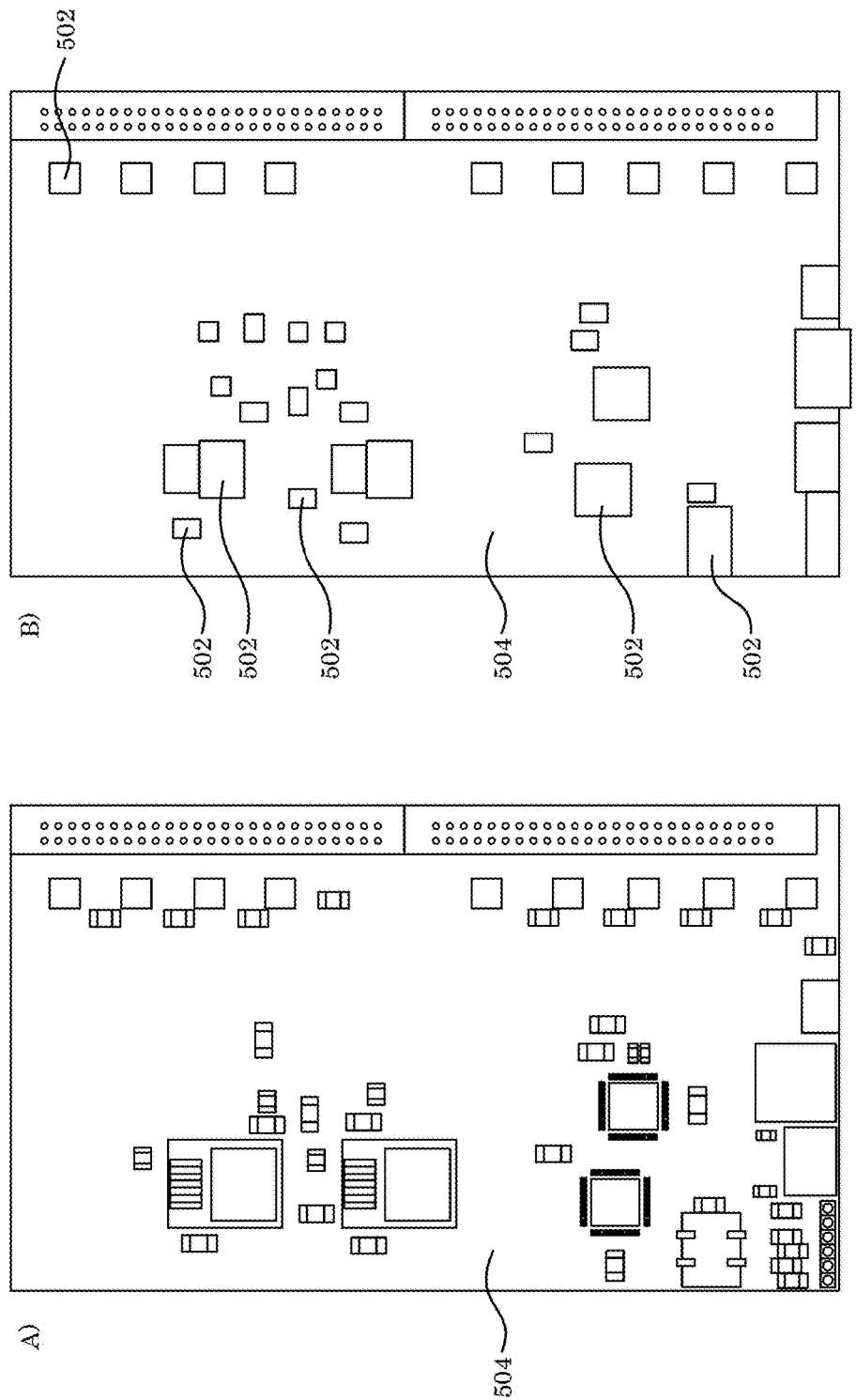
FIG. 30 shows (panel A) a first side view of a probe controller and (panel B) a second side view of the probe controller.

In an embodiment, with reference to FIG. 30, probe controller 122 includes a plurality of electrical components 502 disposed on printed circuit board 504. Electrical components 502 can include resistor to prevent current surge, switching matrix to manage stress and measure operation for a large number of devices using limited number of sources and sensors, amplifier to boost the measured signal to be recorded, microcontroller to manage all the operations, provide the stress voltage value, read the measured result and communicate with the external computer, and the like.

Probe controller 122 is in electrical communication with probe 110 and provides voltage, current, and the like. Waveforms of any type can be used with frequency from DC to RF. Voltage up to 500 V and current up to 1 A supported. Arbitrary waveform is generated locally and on-board high-speed analog to digital converter supports fast signal measurement.

Figure 31:
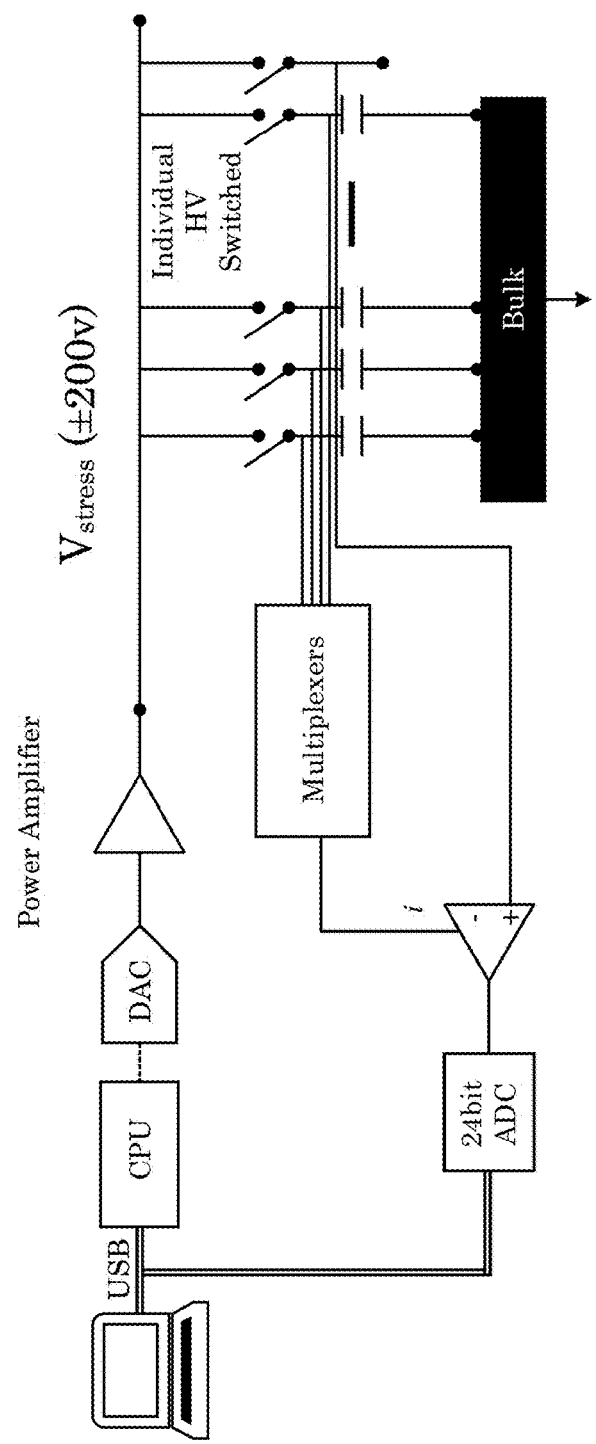
FIG. 31 shows a schematic of the probe controller shown in FIG. 30.

In an embodiment, probe controller 122 includes a printed circuit board and provides electrical stresses on devices 202 on wafer 102, e.g., a semiconductor device, and measures lifetime performance of wafer 102. Probe controller 122 can plug into connectors 308 and 310 of probe 110. FIG. 31 shows an exemplary schematic of probe controller 122 to perform time dependent dielectric breakdown (TDDB) on ultra-thin dielectric devices such as high-k metal gate MOSFET. Here, probe controller 122 includes an on-board microcontroller to communicate with devices 202 on wafer 102 to perform voltage conditioning and switching. Accordingly, devices 202 are subject to a stress voltage such that a response of devices 202 can be measured as a function of time to provide temporal data of respective responses of devices 202. Probe controller 122 is in electrical communication (e.g., via a USB cable) with system controller 120 they can be disposed on control platform 116.

In an embodiment, probe controller 122 plugs directly into probe 110, eliminating wires and improving noise performance. Probe controller 122 provides electric stress and performs sensing of the gate leakage current of devices 202 on wafer 102. In a certain embodiment, probe controller 122 includes circuitry to test the reliability of thick oxides used in power devices (e.g., 50-70 nm thick oxide) and supports stress voltage, e.g., up to 200 V. It is contemplated that, in a TDDB measurement on SiC, devices 202 are single terminal SiC MOS capacitors sharing substrate 200 as a common terminal of wafer 102 on chuck 108. The stress voltage is generated on board probe controller 122 and applied in parallel to contactors 112 through digitally-controlled high-voltage switches on probe controller 122. This allows the interruption of the stress on broken devices. Leakage current of individual devices 202 (e.g., each capacitor disposed on wafer 102) can be sequentially selected and its respective response fed back to the microcontroller disposed on probe controller 122.

According to an embodiment, probe controller 122 is designed for logic devices with thin gate oxides (e.g., a high-k metal gate stack) and provides a stress voltage of up to +/−7 V, AC stress with a frequency, e.g., of up to 2 MHz, and the like. Depending on testing performed on wafer 102, each test station 106 allows easy reconfiguration by plugging probe controller designed to a selected test for reliability.

In an embodiment, massively parallel wafer-level reliability system 100 includes system controller 120 in electrical communication with probe controller 122, test platform 104, test station 106, thermal controller, position manipulator 124, and the like. System controller digitally communicate the stress and measure condition and sequence to the probe controller 122 and receive, digitally the measurement result from the probe controller for further processing and storage. System controller 120 can be disposed on control platform 116. System controller 120 provides a plurality of control signals and receives feedback from probe controller 122. In an embodiment, system controller 120 receives data from probe controller 122 as probe controller 122 provides voltage or electric current to contactors 112.

Exemplary system controllers include personal computer, laptop computer, and the like. In an embodiment, system controller 120 includes high port count USB hub.

System controller 122 is in electrical communication with probe controller 122 and provides instructions for the stress and measure operations, Massively parallel wafer-level reliability system 100 can be made by a combination of custom design/built components as well as commercially available components. A custom designed test platform 104 serve as a base to mount all the components to make the system 100. The result is an integrated system with minimum need for wiring and external control. In one embodiment, a system has 30 test stations 106 with a total of 3000 contacts. Instead of 3000 dedicated source/measure cables connecting to 3000 source/measure controllers as would be in most systems, only 30 USB cables connected to one system controller is needed.

The process and articles herein have numerous beneficial uses, including performing massively parallel wafer-level reliability testing on a plurality of wafers. In an embodiment, a process for massively parallel wafer-level reliability testing includes providing massively parallel wafer-level reliability system 100 disposing a plurality of wafers 102 on massively parallel wafer-level reliability system 100 such that individual test stations 106 receive wafer 102 disposed on chuck 108; contacting wafer 102 disposed on chuck 108 with contactors 112 of probe 110; and testing, in parallel, a reliability of wafers 102 to perform massively parallel wafer-level reliability testing. Here, the process for massively parallel wafer-level reliability testing further can include, with respect to individual test stations 106: controlling, by system controller 120, probe controller 122 that is in electrical communication with probe 110; producing a stress condition by probe controller 122 in response to control by system controller 120; and subjecting wafer 102 to the stress condition via contactors 112.

The process further can include: rotating a first test station 106 of the plurality of test stations 106 in a field of view of optical microscope 126; aligning a position of contactors 112 of first test station 106 to wafer 102 disposed on chuck 108 of first test station 106; rotating second test station 106 of the plurality of test stations 106 in the field of view of optical microscope 126; and aligning a position of contactors 112 of second test station 106 to wafer 102 disposed on chuck 108 of second test station 106.

The process further can include, with respect to individual test stations: controlling, by system controller 120, temperature controller 114; and heating wafer 102 to a temperature in response to control of temperature controller 114 by system controller 120.

Disposing wafer 102 on chuck 108 includes rough positioning of the wafer on the chuck and raise the temperature of the chuck to the stress temperature. Wait until temperature is reached and stabilized. Contacting wafer 102 with contactors 112 includes raising the chuck, and therefore the wafer, up toward the contactors until reliable contact is made as evidenced by over traveling a little bit. Testing the reliability of wafer 102 includes apply the needed voltage/current to all devices and at specific time point, select a device for measurement, apply the measurement condition, and made measurement. Immediately after measurement, return the device to stress condition. At next time point, select another device for measurement. Sequentially measure all the devices. Repeat this process again at a series of late time point to obtain a history of device characteristic under stress over time. When a device reaches a pre-defined characteristic, such as certain leakage current, the stress test for this particular device is considered complete and the device is removed from the stress condition while all others are continued to be stressed.

Instructed by system controller 120, probe controller 122 produces the stress condition to stress wafer 102 via the contactors 112.

In the process, the stress condition can include a voltage to test for a dielectric breakdown, temperature-bias-instability, intrinsic breakdown, extrinsic breakdown, hot-carrier lifetime, or a combination comprising at least one of the foregoing reliability tests. For dielectric breakdown reliability tests, stress can be constant or varied over time. For temperature-bias-instability reliability tests, stress is constant.

Advantageously, a total number of wafers 102 disposed on the test stations 106 is greater than or equal to 4 wafers, greater than or equal to 1000 wafers, and more specifically from 4 to 40 wafers.

Temperature controller 114 controls the temperature of the wafer disposed on the chuck from −60° C. to 500° C., specifically from −30° C. to 400° C., and more specifically from −20° C. to 400° C.

Massively parallel wafer-level reliability system 100 has numerous beneficially and advantageous properties. The ability to stress a large number of wafer-level devices simultaneously in a single compact system is highly desirable but not achievable before. Indeed, the ability to have 3000 devices stress and measured in parallel in a compact system is generally thought no possible. In addition, the use of many mini test stations 106, each completely independently controlled is an important advantage that is not obvious. Previous attempts to increase the number of devices under test in one system subject all devices to the same stress and test—a test is not complete until all devices reach the target characteristics. In a long term reliability test, device test time is statistical. Larger number of device will take longer to completely finish the test. In other words, instead of waiting for 3000 devices to finish, we only have to wait for 100 devices to finish. A common necessity in reliability tests is to use many stress conditions to construct the acceleration model. For each condition, 100 to 200 devices are good enough. The fully independent mini test station 106 allows many stress conditions to be tested simultaneously. Integrating the stress and measure electronics (probe controller 122) and letting it tightly couple to the contactor 112 allow for low noise and high-speed measurement to be achieved simultaneously. Most commercial system the electronics are too far away to support RF measurement. The integrated probe controller uses solid-state switches and switching matrix instead of the common approach of using solenoid (electromechanical switch). The compactness of solid-state switches allows the large number of channels to be accommodated in a tight space. A side benefit is much enhanced reliability. Solenoids usually have a lifetime of a million switching event. For long term tests with frequent measurements (and therefore frequent switching), this is a serious limitation. Solid-state switches have nearly unlimited switching event as well as switch much faster. The system reliability is greatly enhanced. High density contactor 112 making reliable contact to device at temperature up to 400 C is also thought not possible, particularly for long-term tests.

The articles and processes herein are illustrated further by the following Examples, which are non-limiting.

EXAMPLES

Example 1. Massively Parallel Wafer-Level Reliability System

Figure 32:
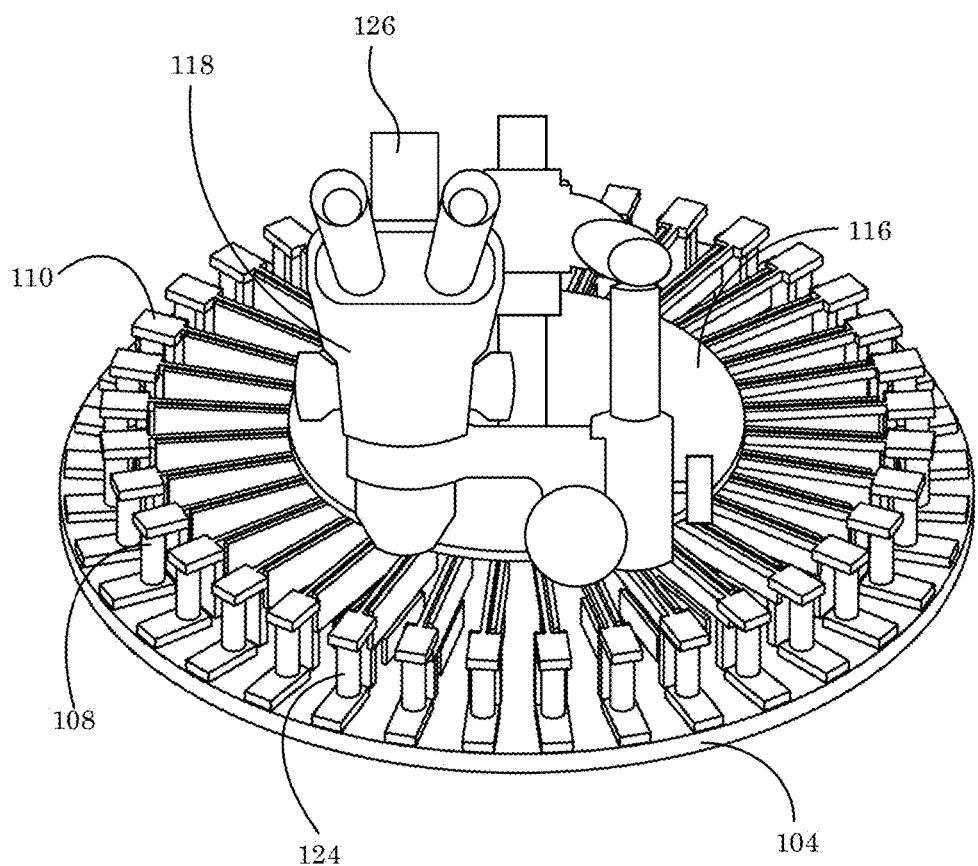
FIG. 32 shows a photograph of a massively parallel wafer-level reliability system.

A massively parallel reliability system, shown in FIG. 32, was constructed and included 30 different testing stations mounted on a rotating tray that allowed placement of a given station under a microscope for device alignment. The different units of each probe station contained a metallic chuck where the diced piece of wafer is mounted for measurement. The chuck was mounted on a micromanipulator with 6 axis of freedom for alignment. A custom circuit board with temperature feedback was used to power the heated chuck. For each test station, a dedicated probe card was used with 100 probes in a 50×2 configuration. The electronics board plugged directly into the probe card, eliminating wires and improving noise performance. The electronics board provided the electric stress and performs sensing of the gate leakage current. The electronic board was designed for thick oxides used in power devices (50-70 nm oxide thickness) and supported stress voltage up to 100V.

For TDDB measurements, the devices under test were single terminal SiC MOS capacitors and shared the substrate as a common terminal. A second electronic board was designed for logic devices with thin gate oxides. The low voltage board was designed to test fifty 2-terminal MOS capacitors with a stress voltage of up to +/−7 V.

Depending on testing, the versatile design of each station provided easy reconfiguration by plugging the testing board specific to the application. We tested a total of 600 nMOS SiC capacitors (40×250 um$^2$) with 50 nm thermally grown SiO2 gate oxide. Fifteen different TDDB stress conditions (7.8 MV/cm-9.8 MV/cm, substrate injection mode, and 150 C-300 C) were applied to groups of 50 devices each. The oxide fields were corrected for the flat-band voltage [$E_{OX}$=($V_G/t_{ox}$)−$V_{FB}$] with $V_{FB}$~1V.

The system here overcomes problems with conventional semiconductor device reliability tests that are generally based on data acquired from accelerated tests at elevated temperatures and increased voltages. The accuracy of the reliability projections is strongly affected by the testing statistics (number of tested devices). The failure distributions confidence bounds are highly spread with low statistics, which introduces significant errors. With the increased variability in newer technologies, the confidence bounds are more spread, which requires even higher statistical samples to be tested. Unfortunately, the number of devices that can be tested at each test condition is usually limited by the test equipment's capacity to test multiple devices simultaneously. Additionally, moderately accelerated (time consuming) tests are preferred to avoid the triggering of degradation mechanisms that are not present during normal operation. Consequently, reliability tests, such as Time Dependent Dielectric Breakdown (TDDB) for example, are increasingly taking longer times, and require a significant amount of testing equipment. The massively parallel wafer-level reliability system presented in this example is a new and compact wafer level testing platform where the number of test channels is increased to 30 parallel 100-probe stations (3000 probes). TDDB testing is demonstrated by testing the TDDB reliability of a new generation of SiC MOS capacitors.

Figure 33:
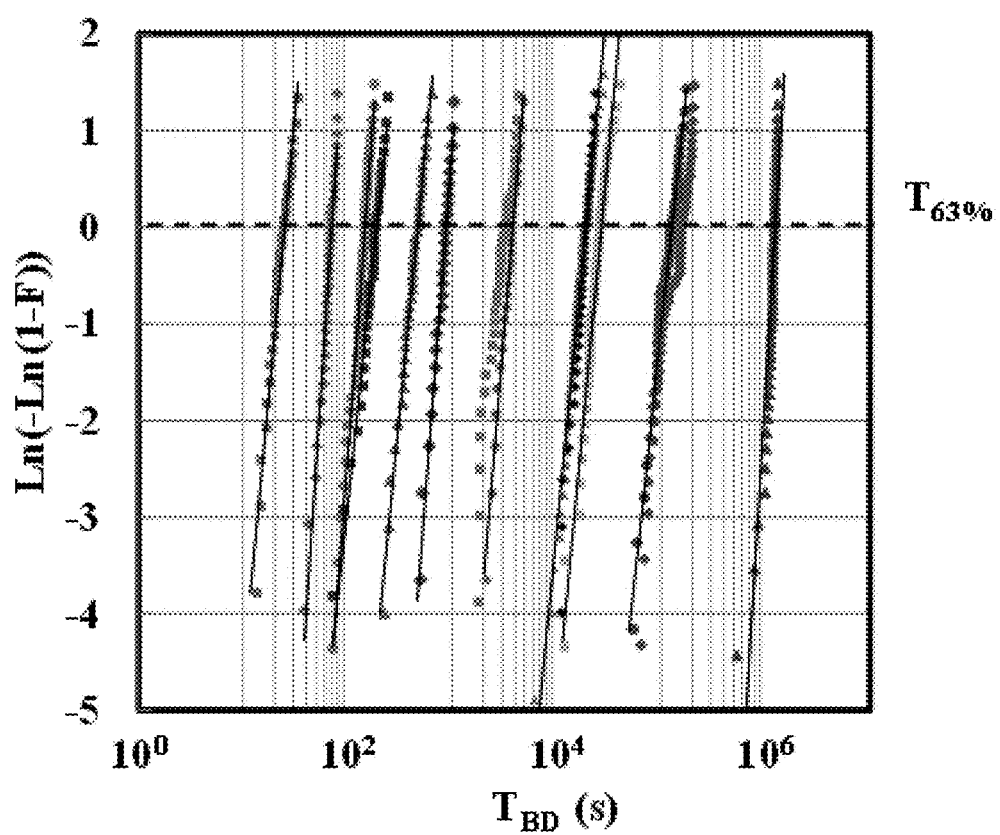
FIG. 33 shows a graph of cumulative failure distributions versus breakdown time.
Figure 34:
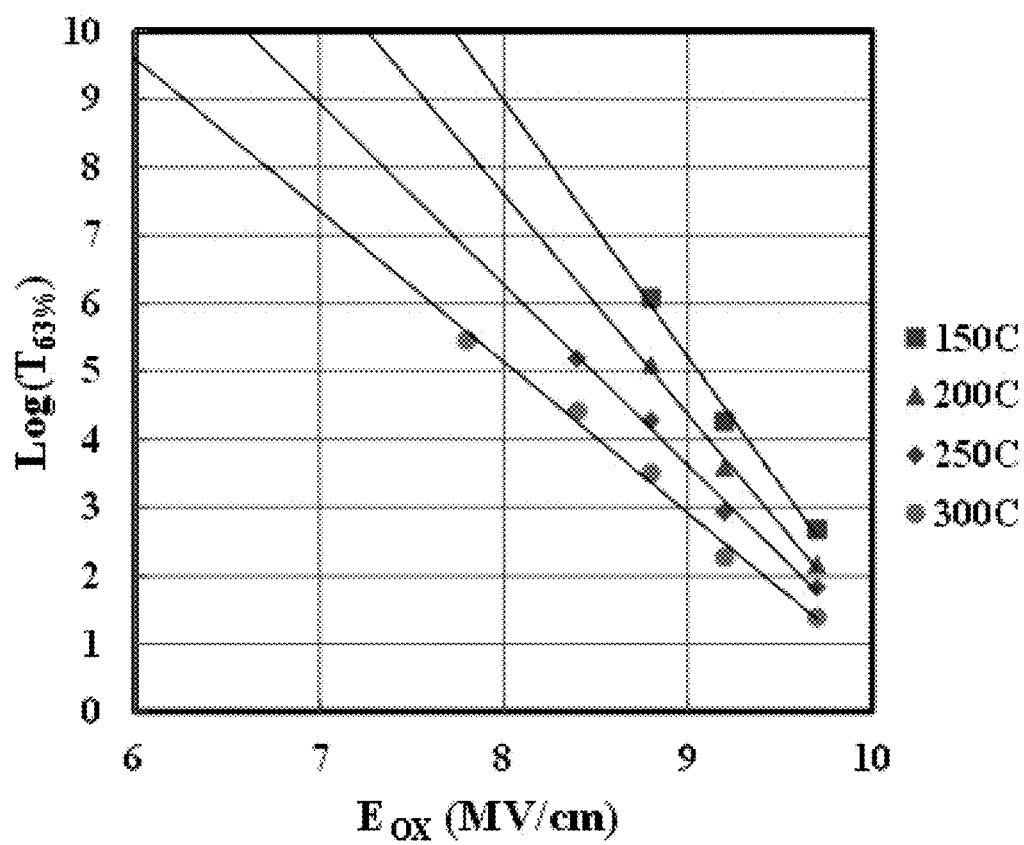
FIG. 34 shows a graph of lifetime versus electric field strength for a plurality of temperatures.
Figure 35:
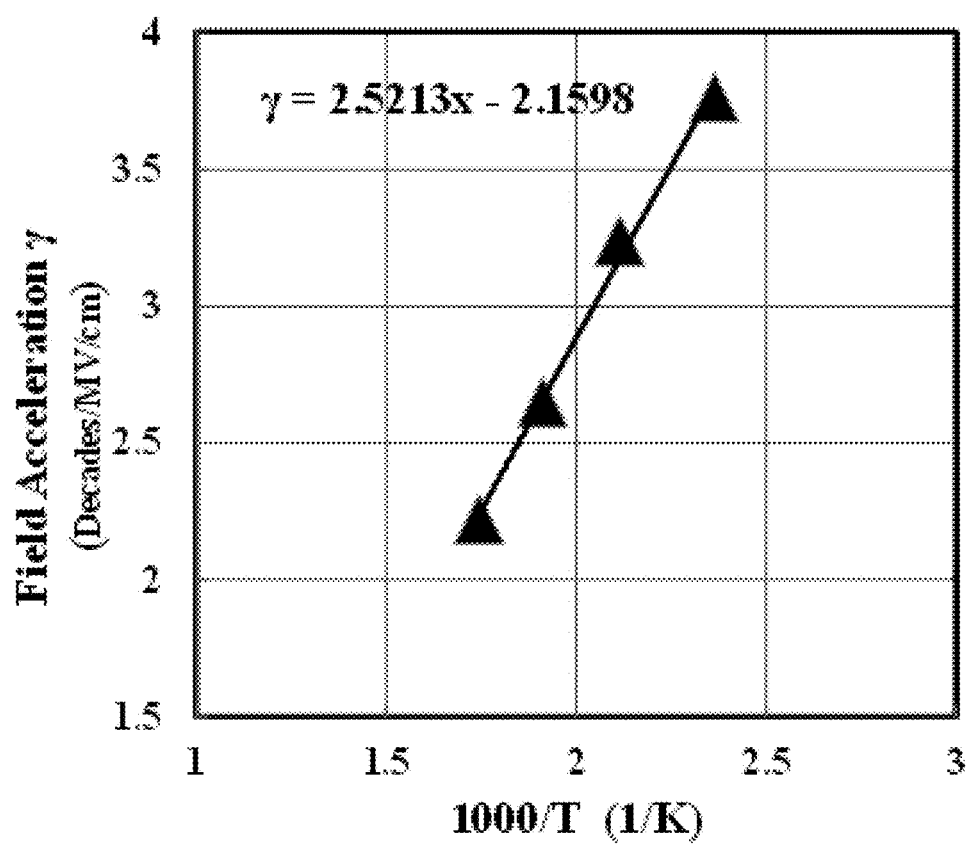
FIG. 35 shows a graph of field acceleration versus inverse temperature.
Figure 36:
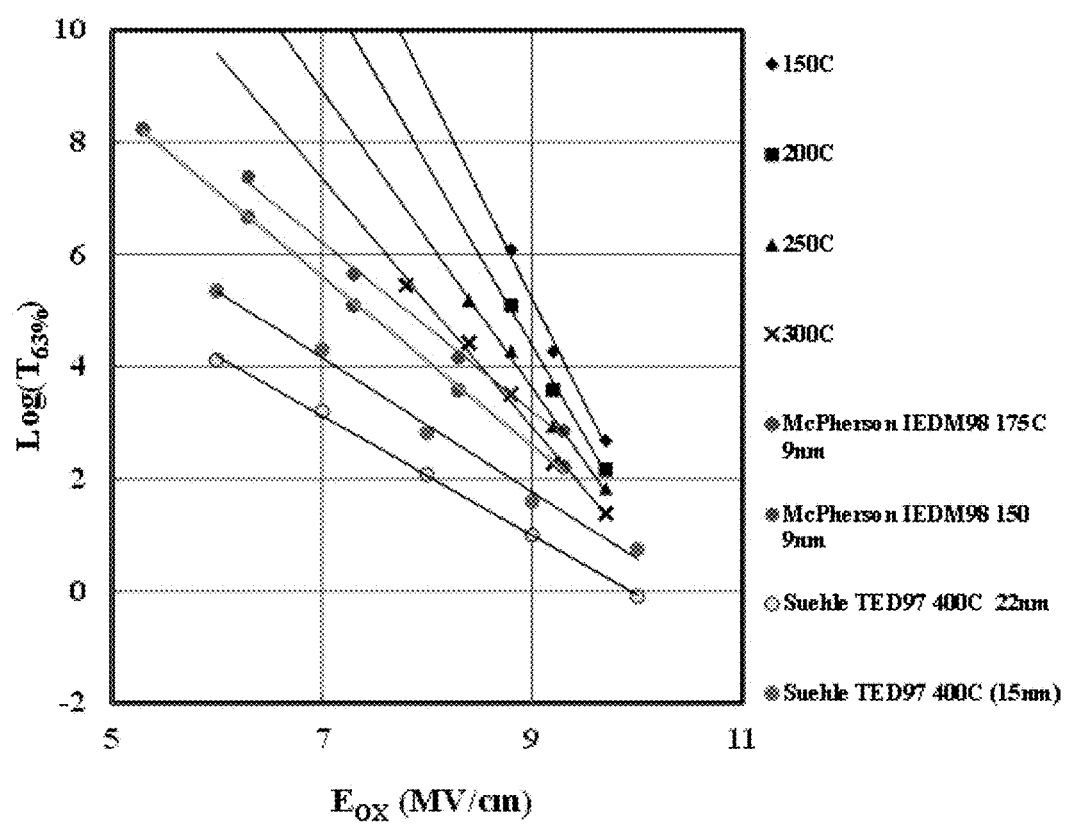
FIG. 36 shows a graph of lifetime versus electric field strength.

FIG. 33 shows the cumulative failure distributions as a function of breakdown time for all tested devices. The data were from tests subjected to SiC using TDDB testing. Data from the SiC devices do not show early extrinsic failures. FIG. 34 and FIG. 35 show data for characteristic lifetime ($T_{65\%}$) field acceleration and temperature acceleration, respectively. The field acceleration and the activation energy were temperature dependent and field dependent, respectively. Similar observations were found in thick $SiO_2$/Si when the quality of the Si devices was reaching maturity. Because SiC was a wide bandgap material, the gate tunneling barrier with SiO2 was 2.7 eV, which was 0.4 eV lower than that of SiO2/Si. Good statistics from sufficiently large sample size were provided by the massively parallel wafer-level reliability system for reliability projections.

Example 2. Time Dependent Dielectric Breakdown in SiC MOS Capacitors

The massively parallel wafer-level reliability system described in Example 1 was used to perform time dependent dielectric breakdown reliability testing on SiC MOS capacitors. Here, the system provided a stress voltage up to ±200V and a stress temperature up to 400 C.

TDDB data were collected from more than 600 nMOS SiC capacitors with a gate area of 40×250 um2. The gate oxide is a thermally grown, 50 nm thick SiO2 fabricated in a matured production environment. Fifteen different TDDB stress conditions (8.2 MV/cm-9.5 MV/cm, substrate injection mode, and 150° C.-300° C.) were applied to groups of 50 devices each.

Figure 37:
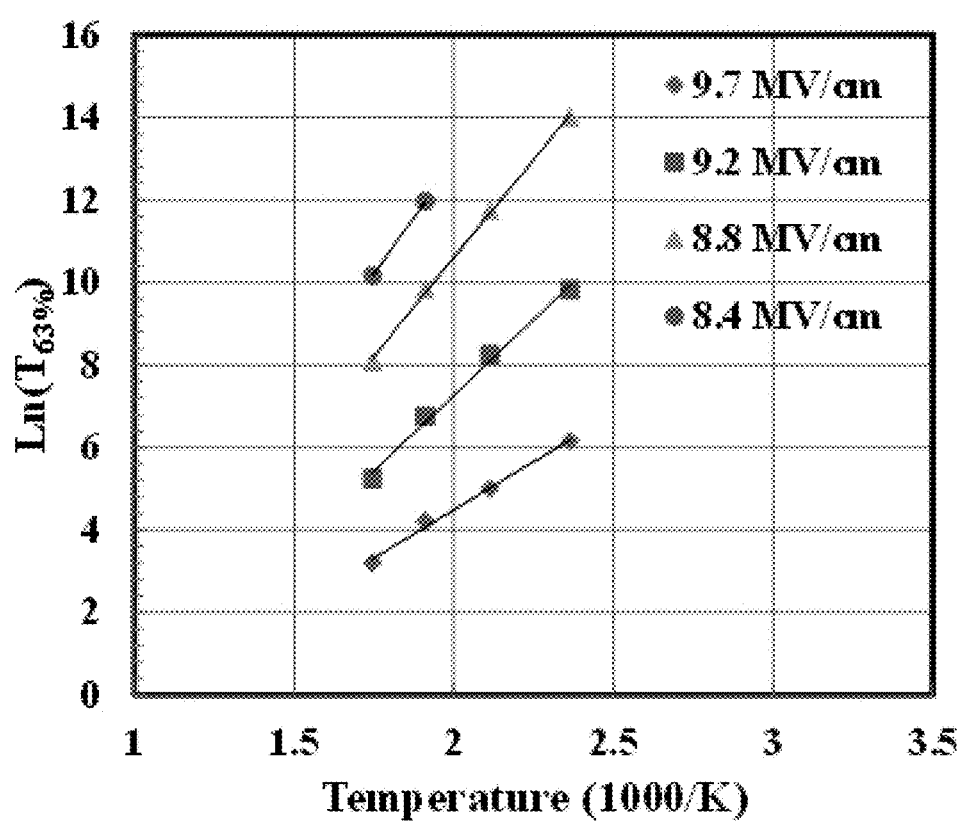
FIG. 37 shows a graph of lifetime versus inverse temperature.

FIG. 33 shows the cumulative failure distribution as a function of breakdown time for all measured devices in Weibull scale. The Weibull distributions showed no signs of early failure. The data shows an absence of extrinsic failures. FIG. 37($a$) shows the measured lifetimes at different stress fields and four different stress temperatures. The field acceleration factor was temperature dependent. FIG. 37($b$) shows the variation of the field acceleration with temperature. It was linearly proportional to the inverse of the temperature (the linear fit is $y=b/T+C$).

Figure 38:
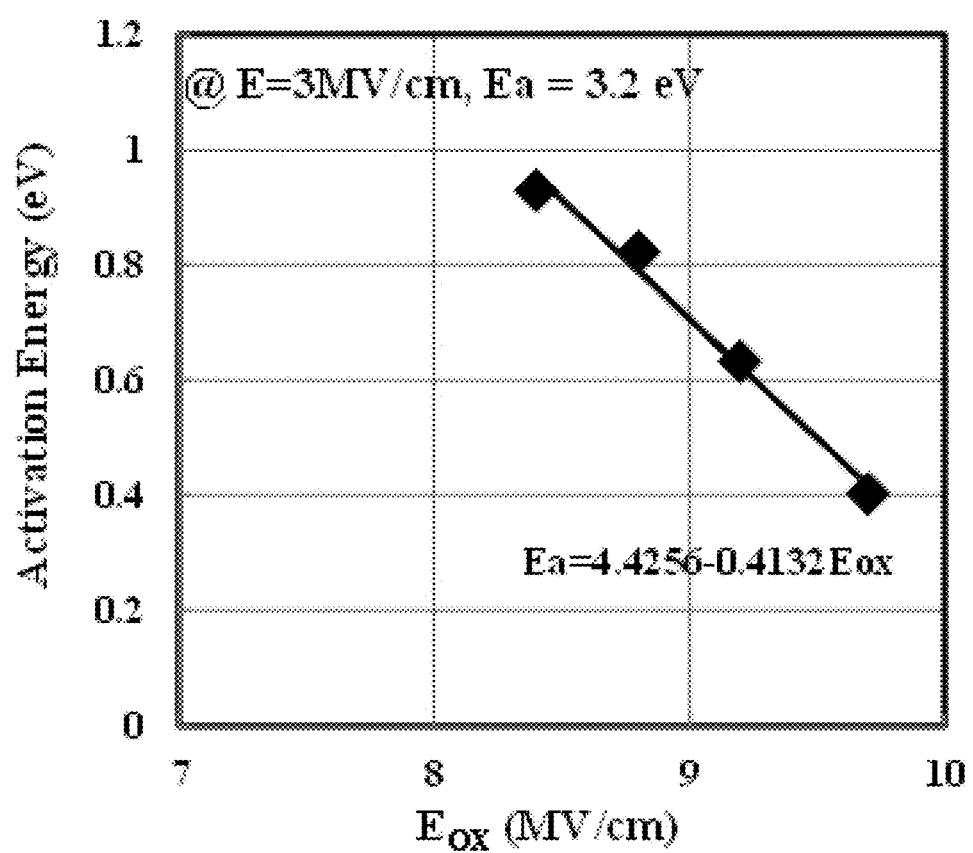
FIG. 38 shows a graph of activation energy versus electric field strength.

FIG. 38($a$) shows the measured lifetimes at different stress temperatures and different fields. The change in slope at different stress fields is shown in FIG. 38($b$), wherein the field dependence of the activation energy is plotted. The activation energy of breakdown was reasonably linear to the oxide field. The extrapolation of the activation energy of breakdown into operation conditions resulted in an activation energy of breakdown of 3.1 eV at E=3 MV/cm.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

Reference throughout this specification to "one embodiment," "particular embodiment," "certain embodiment," "an embodiment," or the like means that a particular feature, structure, or characteristic described in connection with the embodiment is included in at least one embodiment. Thus, appearances of these phrases (e.g., "in one embodiment" or "in an embodiment") throughout this specification are not necessarily all referring to the same embodiment, but may. Furthermore, particular features, structures, or characteristics may be combined in any suitable manner, as would be apparent to one of ordinary skill in the art from this disclosure, in one or more embodiments.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." Further, the conjunction "or" is used to link objects of a list or alternatives and is not disjunctive; rather the elements can be used separately or can be combined together under appropriate circumstances. It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

What is claimed is:

1. A massively parallel wafer-level reliability system to test a reliability of a plurality of wafers, the system comprising:
    a test platform;
    a plurality of test stations disposed on the test platform, wherein an individual test station receives a wafer of the plurality of wafers and comprises:
        a chuck disposed on the test platform to receive the wafer;
        a probe comprising a plurality of contactors, the contactors to electrically contact the wafer disposed on the chuck; and
        a temperature controller disposed on the chuck to control a temperature of the wafer disposed on the chuck;
    a control platform disposed among the plurality of test stations, the test platform and the control platform having relative motion such that the test stations are selectively positioned with respect to a location of a fiduciary disposed on the control platform; and
    a system controller disposed on the control platform to independently control the test stations and in electrical communication with the temperature controller,
    wherein the reliability of the wafers is tested in parallel by the test stations.

2. The massively parallel wafer-level reliability system of claim 1, wherein the probe further comprises:
a probe controller in electrical communication with the contactors,
wherein the probe controller controls an electronic functionality of the probe.

3. The massively parallel wafer-level reliability system of claim 2, wherein the system controller is in electrical communication with the probe controller.

4. The massively parallel wafer-level reliability system of claim 1, wherein individual test stations further comprise:
a position manipulator disposed on the chuck to position the wafer relative to the contactors of the probe.

5. The massively parallel wafer-level reliability system of claim 1, wherein the fiduciary comprises an optical microscope in optical communication with the contactors and the wafer to aid in positioning the wafer relative to the contactors.

6. The massively parallel wafer-level reliability system of claim 1, wherein the reliability of the wafers that is tested in parallel by the test stations comprises dielectric breakdown, temperature-bias-instability, intrinsic breakdown, extrinsic breakdown, or a combination comprising at least one of the foregoing reliability tests.

7. The massively parallel wafer-level reliability system of claim 1, further comprising the wafers.

8. The massively parallel wafer-level reliability system of claim 7, wherein the wafers independently comprise a capacitor or a combination comprising at least one of the foregoing electrical elements.

9. The massively parallel wafer-level reliability system of claim 1, wherein a number of wafers disposed on the test stations is greater than or equal to 100 wafers.

10. The massively parallel wafer-level reliability system of claim 9, wherein the number of wafers is greater than or equal to 1000 wafers.

11. The massively parallel wafer-level reliability system of claim 1, wherein the temperature controller controls the temperature of the wafer disposed on the chuck from −60° C. to 500° C.

12. The massively parallel wafer-level reliability system of claim 1, wherein a number of contactors of the probe is greater than or equal to 20.

13. The massively parallel wafer-level reliability system of claim 1, wherein the relative motion of the control platform and the test platform comprises rotary motion of the test stations about the control platform.

14. The massively parallel wafer-level reliability system of claim 1, wherein the relative motion of the control platform and the test platform comprises linear motion of the test stations relative to the control platform.

15. A process for massively parallel wafer-level reliability testing, the process comprising:
providing a massively parallel wafer-level reliability system that comprises:
a test platform;
a plurality of test stations disposed on the test platform, wherein an individual test station comprises:
a chuck disposed on the test platform;
a probe comprising a plurality of contactors, the contactors to electrically contact the wafer disposed on the chuck; and
a temperature controller disposed on the chuck to control a temperature of the wafer disposed on the chuck;
a control platform disposed among the plurality of test stations, the test platform and the control platform having relative motion such that the test stations are selectively positioned with respect to a location of a fiduciary disposed on the control platform, and
a system controller disposed on the control platform and in electrical communication with the temperature controller,
disposing a plurality of wafers on the massively parallel wafer-level reliability system such that individual test stations receive a wafer disposed on the chuck;
contacting the wafer disposed on the chuck with the contactors of the probe; and
testing, in parallel, a reliability of the wafers to perform massively parallel wafer-level reliability testing.

16. The process for massively parallel wafer-level reliability testing of claim 15, further comprising, with respect to individual test stations:
controlling, by the system controller, a probe controller that is in electrical communication with the probe;
producing a stress condition by the probe controller in response to control by the system controller; and
subjecting the wafer to the stress condition via the contactors.

17. The process for massively parallel wafer-level reliability testing of claim 16, wherein the stress condition comprises a voltage to test for a dielectric breakdown, temperature-bias-instability, intrinsic breakdown, extrinsic breakdown, or a combination comprising at least one of the foregoing reliability tests.

18. The process for massively parallel wafer-level reliability testing of claim 15, further comprising:
rotating a first test station of the plurality of test stations in a field of view of an optical microscope;
aligning a position of the contactors of the first test station to the wafer disposed on the chuck of the first test station;
rotating a second test station of the plurality of test stations in the field of view of the optical microscope; and
aligning a position of the contactors of the second test station to the wafer disposed on the chuck of the second test station.

19. The process for massively parallel wafer-level reliability testing of claim 15, further comprising, with respect to individual test stations:
controlling, by the system controller, the temperature controller; and
heating the wafer to a temperature in response to control of the temperature controller by the system controller.

20. The process for massively parallel wafer-level reliability testing of claim 15, wherein the temperature is from −60° C. to 500° C.

* * * * *